(12) United States Patent
Imazu et al.

(10) Patent No.: US 9,391,050 B2
(45) Date of Patent: Jul. 12, 2016

(54) SEMICONDUCTOR LIGHT EMITTING DEVICE AND FABRICATION METHOD FOR SAME

(71) Applicants: Kenji Imazu, Saitama (JP); Yuzuru Wada, Yamanashi (JP)

(72) Inventors: Kenji Imazu, Saitama (JP); Yuzuru Wada, Yamanashi (JP)

(73) Assignees: CITIZEN HOLDINGS CO., LTD., Tokyo (JP); CITIZEN ELECTRONICS CO., LTD., Yamanashi (JP)

( * ) Notice: Subject to any disclaimer, the term of this patent is extended or adjusted under 35 U.S.C. 154(b) by 0 days.

(21) Appl. No.: 14/376,414

(22) PCT Filed: Feb. 1, 2013

(86) PCT No.: PCT/JP2013/052380
§ 371 (c)(1),
(2) Date: Aug. 1, 2014

(87) PCT Pub. No.: WO2013/115379
PCT Pub. Date: Aug. 8, 2013

(65) Prior Publication Data
US 2015/0048390 A1     Feb. 19, 2015

(30) Foreign Application Priority Data

Feb. 2, 2012  (JP) ................. 2012-020708
Feb. 13, 2012 (JP) ................. 2012-028264

(51) Int. Cl.
*H01L 25/075* (2006.01)
*H01L 33/50* (2010.01)
(Continued)

(52) U.S. Cl.
CPC ............ *H01L 25/0753* (2013.01); *H01L 24/81* (2013.01); *H01L 24/95* (2013.01);
(Continued)

(58) Field of Classification Search
CPC ... H01L 25/0753; H01L 33/60; H01L 33/507; H01L 33/54; H01L 33/62; H01L 25/0756; H01L 24/81; H01L 24/95; H01L 24/97; H01L 33/505; H01L 33/46; F21V 19/001
USPC .......................................................... 257/88
See application file for complete search history.

(56) References Cited

U.S. PATENT DOCUMENTS

| 6,346,777 B1 * | 2/2002 | Kim ........................... 315/185 S |
| 2004/0188697 A1 * | 9/2004 | Brunner et al. ................. 257/99 |

(Continued)

FOREIGN PATENT DOCUMENTS

| JP | S56-149477 U | 11/1981 |
| JP | S61-263191 A | 11/1986 |

(Continued)

OTHER PUBLICATIONS

Internal Search Report for PCT Application No. PCT/JP2013/052380, Feb. 26, 2013.

(Continued)

*Primary Examiner* — Latanya N Crawford

(57) ABSTRACT

The purpose of the present invention is to provide a double-sided light emitting type semiconductor light emitting device that can be easily fabricated even if a semiconductor light emitting element is flip-chip mounted, and to provide a fabrication process for the same. The semiconductor light emitting device has a plurality of lead frames, a plurality of semiconductor light emitting elements connected to the plurality of lead frames, and a covering member that covers the plurality of semiconductor light emitting elements. The semiconductor light emitting device is characterized in that the edge of one lead frame among the plurality of lead frames is disposed in close proximity to the edge of another lead frame so as to form a gap, and the plurality of semiconductor light emitting elements are flip-chip mounted on the front surface and rear surface of the one lead frame and the other lead frame so as to straddle the gap.

9 Claims, 24 Drawing Sheets

(51) Int. Cl.
*H01L 33/54* (2010.01)
*H01L 33/60* (2010.01)
*H01L 33/62* (2010.01)
*H01L 23/00* (2006.01)
*H01L 33/46* (2010.01)

(52) U.S. Cl.
CPC ........... *H01L 24/97* (2013.01); *H01L 25/0756* (2013.01); *H01L 33/507* (2013.01); *H01L 33/60* (2013.01); *H01L 33/46* (2013.01); *H01L 33/505* (2013.01); *H01L 33/54* (2013.01); *H01L 33/62* (2013.01); *H01L 2224/16* (2013.01); *H01L 2224/48091* (2013.01); *H01L 2924/01322* (2013.01)

(56) References Cited

U.S. PATENT DOCUMENTS

| | | | |
|---|---|---|---|
| 2006/0261364 | A1 | 11/2006 | Suehiro et al. |
| 2008/0080181 | A1* | 4/2008 | Yu et al. .......................... 362/249 |
| 2009/0159904 | A1* | 6/2009 | Lai et al. .......................... 257/88 |
| 2010/0320479 | A1 | 12/2010 | Minato et al. |
| 2012/0086034 | A1* | 4/2012 | Yuan et al. ....................... 257/98 |
| 2013/0070452 | A1* | 3/2013 | Urano et al. .................. 362/231 |
| 2013/0182432 | A1* | 7/2013 | Yoo et al. ....................... 362/235 |
| 2014/0209931 | A1* | 7/2014 | Liao ................................ 257/88 |
| 2014/0268779 | A1* | 9/2014 | Sorensen et al. ......... 362/249.06 |
| 2014/0321820 | A1* | 10/2014 | Schunk et al. ................. 385/93 |

FOREIGN PATENT DOCUMENTS

| | | |
|---|---|---|
| JP | H05-343744 A | 12/1993 |
| JP | H07-176791 A | 7/1995 |
| JP | 2003-229603 A | 8/2003 |
| JP | 2005-333014 A | 12/2005 |
| JP | 2006-054211 A | 2/2006 |
| JP | 2006-310584 A | 11/2006 |
| JP | 2007-19096 A | 1/2007 |
| JP | 2009-049386 A | 3/2009 |
| JP | 2009-218274 A | 9/2009 |
| JP | 2011-233552 A | 11/2011 |
| WO | 2009/069671 A1 | 6/2009 |

OTHER PUBLICATIONS

International Preliminary Report on Patentability for PCT Application No. PCT/JP2013/052380, Sep. 11, 2013.
State Intellectual Property Office of the People's Republic of China, Office Action for Chinese patent application No. 201380007815.6, Apr. 5, 2016.

* cited by examiner (a)

(b)

(c)

(d)

(e)

(f)

(g)

(h)

(i)

(a)

(b)

(c)

(a)

(b)

(a)

(b)

(a)

(b)

(a)

(b)

(c)

in the bottom face 505a of the reflective cup 505.
The LED chip 504c is flip-chip mounted on the bottom face
505a of the reflective cup 505 in such a manner as to straddle
the gap between the electrode patterns 507a and 507b. The
reflective cup 505 is filled with an optically transmissive resin
508.

Another possible method for increasing the brightness of
the LED device is by increasing the number of LED dies. For
example, it is known in the art to mount four or more LED dies
on both sides of the circuit substrate (for example, refer to
FIG. 1 in patent document 3). FIG. 27 is a diagram corresponding
to FIG. 1 in patent document 3. For convenience,
some of the reference numerals used to designate the component
elements are changed.

FIG. 27 is a cross-sectional view of a light source device
(LED device) 605A having a light emitting element (LED
die) mounting enamel substrate 601a. In the light source
device 605A, light emitting elements 606 are mounted in
reflective recessed portions 604d formed in both surfaces J
and K of the light emitting element mounting enamel substrate
601a, and the reflective recessed portions 604d are each
filled with a transparent resin 609 to seal the light emitting
element 606 therein. The light emitting element mounting
enamel substrate 601a is formed by covering a core metal
602a with an enamel layer 603, and a total of six reflective
recessed portions 604d for accommodating the respective
light emitting elements 606 are formed in both surfaces J and
K. An electrode 607c for feeding the light emitting elements
606 is formed on top of the enamel layer 603. A portion of the
electrode 607c is formed so as to extend into the bottom face
of each reflective recessed portion 604d, and the light emitting
element 606 is mounted thereon by die bonding or wire
bonding.

SEMICONDUCTOR LIGHT EMITTING DEVICE AND FABRICATION METHOD FOR SAME

TECHNICAL FIELD

The present invention relates to a double-sided semiconductor
light emitting device fabricated by flip-chip mounting
semiconductor light emitting elements on both sides of a
leadframe, and a method for fabricating the same.

BACKGROUND

Semiconductor light emitting devices (hereinafter called
LED devices unless specifically designated otherwise), fabricated
by mounting semiconductor light emitting elements
diced from a wafer (hereinafter called LED dies unless specifically
designated otherwise) on a leadframe or circuit substrate
and packaged by covering them with a material such as
a resin or glass, are widely used in various applications. While
such LED devices can take various configurations according
to the application, LED dies may be mounted on both sides of
a leadframe or circuit substrate in order to increase the
amount of light emission by enlarging the spreading angle of
the LED device while compensating for the strong directional
characteristics that the LED dies exhibit.

LED devices with LED dies mounted on both sides of a
leadframe have been known for a long time (for example,
refer to patent document 1). FIG. 25 is a diagram corresponding
to FIG. 2 in patent document 1. For convenience, some of
the reference numerals used to designate the component elements
have been changed.

In FIG. 25, two light emitting elements (LED dies) 421 are
mounted on the left and right sides of a forward end portion of
a leadframe 422a. Each light emitting element 421 is electrically
connected to a leadframe 422b by a wire. The leadframes
422a and 422b are, respectively, a common positive
terminal and a common negative terminal. The light emitting
elements 421 are sealed with an epoxy resin 423, and light
collecting portions 404 are formed on the left and right sides
of the epoxy resin 423. The semiconductor light emitting
device shown in FIG. 25 has directional characteristics shown
as 404a and 404b in the figure.

When each LED die is connected by a wire, the light
emitting efficiency of the LED device decreases because of
the shadow of the wire. Furthermore, the size of the LED
device increases because there is a need to provide an area for
routing the wires. To address this, each LED die having an
anode and cathode only on one face thereof (hereinafter
called the bottom face) may be connected directly to a leadframe
or to electrodes on a circuit substrate (hereinafter called
flip-chip mounting). It is known that flip-chip mounting contributes
to enhancing the light emitting efficiency and reducing
the mounting area. The major reason is that the anode and
cathode of the LED die are bonded directly to the leadframe
or to the electrodes on the circuit substrate, eliminating the
need for the wire.

An LED device with LED dies flip-chip mounted on both
sides of a circuit substrate as described above is known in the
art (for example, refer to patent document 2). FIG. 26 is a
diagram corresponding to FIG. 2 in patent document 2. For
convenience, some of the reference numerals used to designate
the component elements have been changed.

In FIG. 26, reflective cups 505 for accommodating LED
chips 504c are formed substantially centered in the circuit
substrate 502 and symmetrically between the upper and lower
surface thereof. Each reflective cup 505 includes a bottom
face 505a and a sloping face 505b, and electrode patterns
507a and 507b formed on the upper or lower surface of the
circuit substrate 502 are disposed opposite each other across
a gap formed

PRIOR ART DOCUMENTS

Patent Documents

Patent document 1: Japanese Utility Model Publication No.
S56-149477 (FIG. 2)
Patent document 2: Japanese Unexamined Patent Publication
No. 2003-229603 (FIG. 2)
Patent document 3: Japanese Unexamined Patent Publication
No. 2006-310584 (FIG. 1)

SUMMARY

In the case of the LED device (semiconductor light emitting
device) shown in FIG. 25, the light emitting efficiency is
low compared with the flip-chip mounting type, because of
the use of wires as earlier described.

The LED device shown in FIG. 26 employs flip-chip
mounting, but is not easy to fabricate because the LED dies
(LED chips 504c) are flip-chip mounted in the recessed portions
of the circuit substrate 502. Since a detailed description
of the LED die mounting process is not given in patent document
2, the details of the mounting process is not known. In
one possible fabrication method, for example, each individual
LED die may be picked up and placed on the circuit substrate,
and then the LED die may be connected to the circuit substrate
under heat and pressure. However, with such a simple
method, throughput is restricted because heat and pressure
has to be applied each time one LED die is mounted.

As another possible method, a batch fabrication method often used in volume production may be employed. First, a large single substrate from which individual circuit substrates 502 are diced is prepared. Next, solder paste is applied to the electrodes of the LED dies 504c or to the electrodes formed on the large single substrate and, after tentatively connecting the electrodes of the LED dies 504c to the electrodes of the large single substrate by the solder paste, the solder paste is melted in a reflow oven, thus connecting a large number of LED dies 504c in a collective manner. Next, a transparent resin 508 is filled to seal the LED dies 504c therein. Finally, the large single substrate is diced into individual LED devices. In the above collective connection step, first the LED dies 504c on the upper surface are connected, and then the LED dies 504c on the lower surface are connected. That is, since this fabrication method requires that the substrate be passed through the reflow oven twice, not only does the fabrication process become long, but the fabrication conditions become complex. Furthermore, it is highly likely that the LED device 1 of FIG. 26 may not be able to provide sufficient brightness, because only two LED dies 504c are mounted.

In the case of the LED device (light source device 605A) shown in FIG. 27, the brightness can be increased, since six LED dies (light emitting elements 606) are mounted. However, this LED device is not easy to fabricate because, similarly to the LED device of FIG. 26, the LED dies 606 are mounted inside the reflective recessed portions 604d formed in the circuit substrate (light emitting element mounting enamel substrate 601a). Furthermore, since each LED die 606 is connected to the electrode 607c of the circuit substrate 601a by a wire, the light emitting efficiency drops.

It is an object of the present invention to provide a double-sided semiconductor light emitting device that is easy to fabricate even when semiconductor light emitting elements are flip-chip mounted, and a method for fabricating the same.

It is another object of the present invention to provide a double-sided semiconductor light emitting device that is easy to fabricate even when four or more semiconductor light emitting elements are flip-chip mounted in order to increase the brightness.

A semiconductor light emitting device includes, a plurality of leadframes, a plurality of semiconductor light emitting elements connected to the plurality of leadframes, and a covering member that covers the plurality of semiconductor light emitting elements, and wherein an end portion of one of the plurality of leadframes is located in close proximity to an end portion of another one of the plurality of leadframes, forming a gap therebetween, and the plurality of semiconductor light emitting elements are flip-chip mounted on the front and back surfaces of the one leadframe and that other leadframe in such a manner as to straddle the gap.

Preferably, in the semiconductor light emitting device, the plurality of leadframes include a first leadframe and a second leadframe, the plurality of semiconductor light emitting elements include a first semiconductor light emitting element and a second semiconductor light emitting element, an end portion of the first leadframe is located in close proximity to an end portion of the second leadframe, forming a gap therebetween, the first semiconductor light emitting element is flip-chip mounted on first surfaces of the first and second leadframes in such a manner as to straddle the gap, the second semiconductor light emitting element is flip-chip mounted on second surfaces of the first and second leadframes in such a manner as to straddle the gap, and a portion of the first semiconductor light emitting element and a portion of the second semiconductor light emitting element are disposed facing each other.

Preferably, in the semiconductor light emitting device, the plurality of leadframes include three leadframes, and the plurality of semiconductor light emitting elements form a series-parallel circuit.

Preferably, in the semiconductor light emitting device, the plurality of semiconductor light emitting elements include four semiconductor light emitting elements, and the four semiconductor light emitting elements form a parallel circuit.

Preferably, in the semiconductor light emitting device, the covering member includes a reflective member containing fine reflective particles and a fluorescent member containing a phosphor.

Preferably, in the semiconductor light emitting device, the reflective member is disposed along outer peripheries of the plurality of leadframes and covers the side faces of the fluorescent member, the fluorescent member covers the top faces of the plurality of semiconductor light emitting elements, and a fluorescent resin is filled into space formed between the reflective member and the plurality of semiconductor light emitting elements and into space formed between the plurality of semiconductor light emitting elements that are mounted on the front and back surfaces of the plurality of leadframes so as to face each other.

Preferably, in the semiconductor light emitting device, the fluorescent member covers the top faces of the plurality of semiconductor light emitting elements, and the reflective member is applied to cover the side faces of the plurality of semiconductor light emitting elements and to fill space formed between the plurality of semiconductor light emitting elements that are mounted on the front and back surfaces of the plurality of leadframes so as to face each other.

Preferably, in the semiconductor light emitting device, a portion of the plurality of leadframes protrudes from the covering member.

A semiconductor light emitting device fabrication method includes, a large-sized leadframe preparation step for preparing a large-sized leadframe from which leadframes to be included in each individual semiconductor light emitting device are diced, a first placement step for placing a plurality of semiconductor light emitting elements on a first adhesive sheet, a second placement step for placing a plurality of semiconductor light emitting elements on a second adhesive sheet, a first positioning step for positioning the first adhesive sheet with respect to the large-sized leadframe after the plurality of semiconductor light emitting elements have been placed on the first adhesive sheet, a second positioning step for positioning the second adhesive sheet with respect to the large-sized leadframe after the plurality of semiconductor light emitting elements have been placed on the second adhesive sheet, a connecting step for pressing together the first and second adhesive sheets onto the large-sized leadframe under heat and thereby connecting the plurality of semiconductor light emitting elements to the large-sized leadframe; a covering step for covering the plurality of semiconductor light emitting elements with a covering member after the plurality of semiconductor light emitting elements have been connected to the large-sized leadframe, and a dicing step for dicing the large-sized leadframe.

Preferably, in the semiconductor light emitting device fabrication method, the covering member includes a reflective member containing fine reflective particles and a fluorescent member containing a phosphor, and the covering step covers the side faces of the plurality of semiconductor light emitting elements with the reflective member and covers the top faces of the plurality of semiconductor light emitting elements with the fluorescent member.

Preferably, in the semiconductor light emitting device fabrication method, the reflective member is applied to the side faces of the plurality of semiconductor light emitting elements by using a squeegee.

Preferably, in the semiconductor light emitting device fabrication method, the fluorescent member is a phosphor sheet, and the phosphor sheet is bonded to the top faces of the plurality of semiconductor light emitting elements.

The semiconductor light emitting device can be fabricated by a batch fabrication method that uses two adhesive sheets and a large-sized leadframe, that performs the connection and covering in a collective manner, and that dices the completed large-sized leadframe into individual devices. In the batch fabrication method, since the heating step for connection can be accomplished in a single operation, not only can the process be shorted but the fabrication conditions can be prevented from becoming complex. As a result, a double-sided semiconductor light emitting device that is easy to fabricate can be provided.

The semiconductor light emitting device can be fabricated using a simple fabrication method. That is, it can be fabricated by a batch fabrication method that includes the step of preparing two adhesive sheets and a large-sized leadframe and the collective connection step. Compared with the prior art fabrication method that includes a solder reflow step requiring that the heating step be performed twice in order to mount semiconductor light emitting elements on both sides of a circuit substrate, the batch fabrication method requires that the pressing and heating step be performed only once, which serves to not only shorten the fabrication process but also simplify the fabrication conditions. Furthermore, since the large-sized leadframe is a metal plate formed with openings, the preparatory step can be greatly simplified. Furthermore, the brightness of the semiconductor light emitting device can be increased, since four or more semiconductor light emitting elements are mounted and each semiconductor light emitting element is flip-chip mounted.

According to the semiconductor light emitting device fabrication method, the batch fabrication method that uses adhesive sheets and a large-sized leadframe, that performs the connection and covering in a collective manner, and that dices the completed large-sized leadframe to obtain the desired product is improved so that the semiconductor light emitting elements can be mounted on both sides of the large-sized leadframe by using the two adhesive sheets. With this improved batch fabrication method, since the heating step for connection can be accomplished in a single operation, not only can the process be shorted but the fabrication conditions can be prevented from becoming complex. This serves to simplify the fabrication method of the double-sided semiconductor light emitting device.

DESCRIPTION

Figure 1:
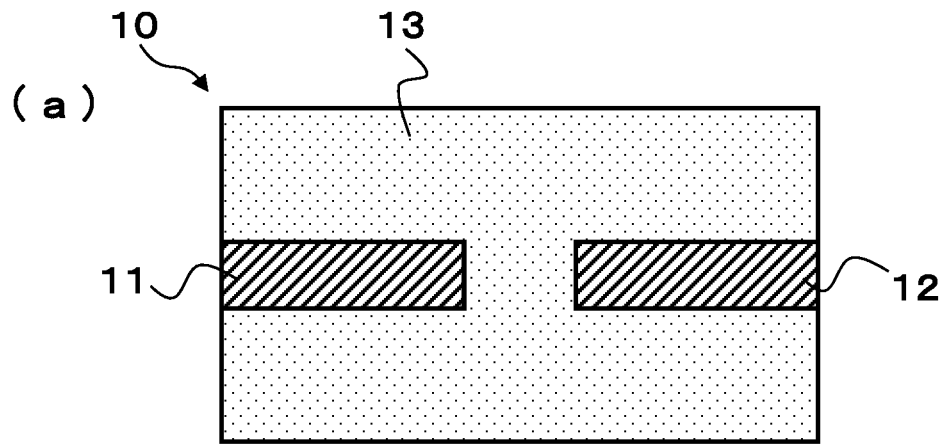
FIG. 1 is a diagram showing the external appearance of an LED device 10: part (a) is a top plan view, (b) is a front view, and (c) is a right side view.
Figure 1:
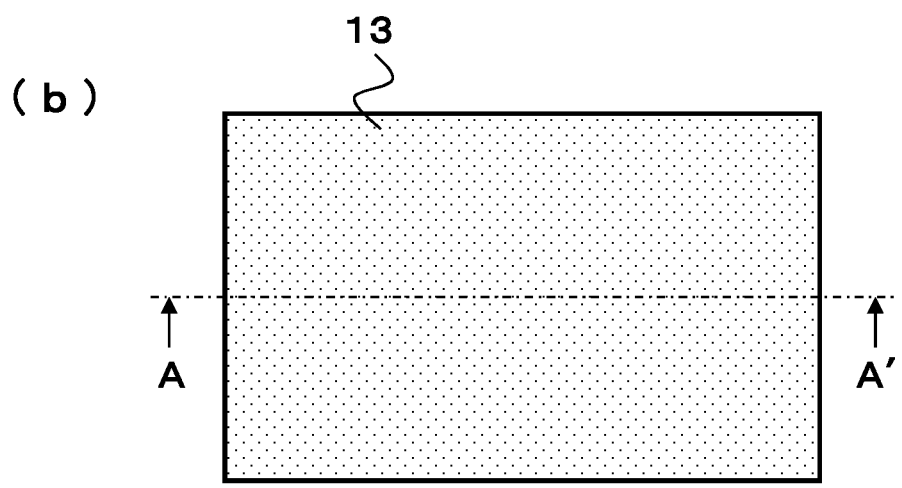
Figure 1:
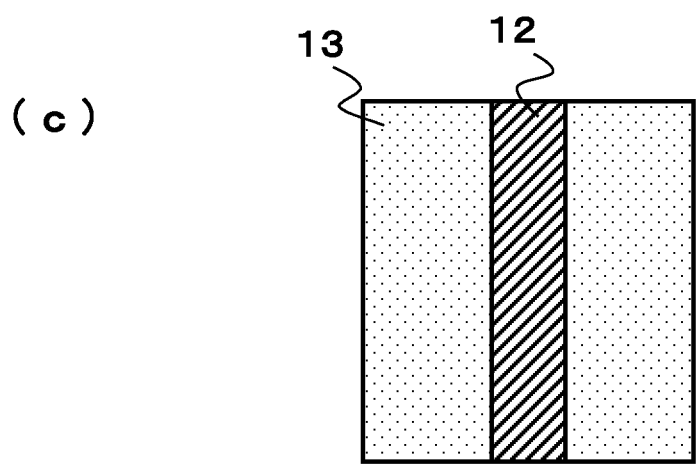

A semiconductor light emitting device and a method for fabricating the semiconductor light emitting device will be described below with reference to the drawings. It will, however, be noted that the technical scope of the present invention is not limited by any particular embodiment described herein, but extends to the inventions described in the appended claims and their equivalents. Further, in the description of the drawings, the same or corresponding component elements are designated by the same reference numerals, and the description of such component elements, once given, will not be repeated thereafter. It will also be noted that the scale to which each component element is drawn is changed as needed for illustrative purposes.

First Embodiment

FIG. 1 is a diagram showing the external appearance of an LED device (semiconductor light emitting device) 10: part (a) is a top plan view, (b) is a front view, and (c) is a right side view.

When the LED device 10 is viewed from the top, a leadframe 11 (first leadframe) and a leadframe 12 (second leadframe) are seen extending horizontally in a rectangular covering member 13 (see FIG. 1(a)). The leadframes 11 and 12 are arranged one adjacent to the other with their end portions in close proximity to each other. The other end portions of the leadframes 11 and 12 are flush with the respective side edges of the covering member 13. When the LED device 10 is viewed from the front, only the covering member 13 is seen (see FIG. 1(b)). When the LED device 10 is viewed from the right side, the leadframe 12 is seen extending vertically in such a manner as to split the covering member 13 (see FIG. 1(c)). Though not shown here, the bottom view of the LED device 10 is the same as the top plan view of FIG. 1(a). The left side view of the LED device 10 is similar to the right side view of FIG. 1(c), except that the leadframe 11 is seen in place of the leadframe 12.

Figure 2:
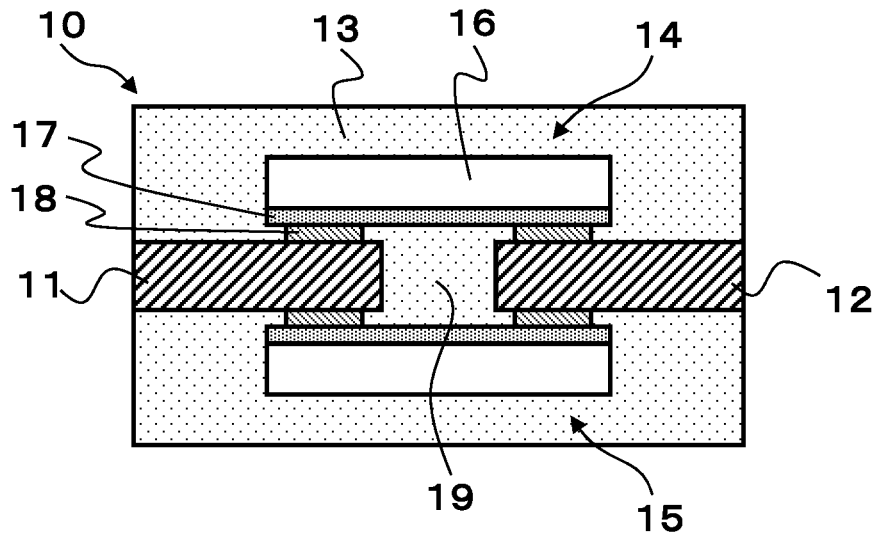
FIG. 2 is a cross-sectional view taken along line AA' in FIG. 1(b).

FIG. 2 is a cross-sectional view taken along line AA' in FIG. 1(b).

The LED device 10 includes an LED die 14 (first semiconductor light emitting element) and an LED die 15 (second semiconductor light emitting element), in addition to the leadframes 11 and 12 and the covering member 13. The LED dies 14 and 15 each comprise a sapphire substrate 16, a semiconductor layer 17, and protruding electrodes 18. In the LED dies 14 and 15, the face on which the semiconductor layer 17 is not formed is called the top face, and the face on which the semiconductor layer 17 and the protruding electrodes 18 are formed is called the bottom face, while the faces connecting between the top and bottom faces are called the side faces.

In the LED dies 14 and 15, the semiconductor layer 17 is formed on the underside of the sapphire substrate 16, and the protruding electrodes 18 are attached to the semiconductor layer 17. The sapphire substrate 16 is a transparent insulating substrate having a thickness of 80 to 120 μm. The semiconductor layer 17 includes an n-type semiconductor layer, a p-type semiconductor layer, an interlayer insulating film, and metal interconnects, and has a thickness slightly smaller than 10 μm. A light emitting layer is formed at the interface between the n-type semiconductor layer and the p-type semiconductor layer, and its plan shape is substantially equal to that of the p-type semiconductor layer. A portion of the n-type semiconductor layer and the p-type semiconductor layer are covered with the interlayer insulating film, and the metal interconnects are formed on the interlayer insulating film and are connected to the protruding electrodes 18. To facilitate flip-chip mounting, the metal interconnects are clustered into an anode and a cathode, respectively, and are rearranged to form the protruding electrodes 18 on the left and right edge portions of the LED die 14, 15. Each protruding electrode 18 is formed as a bump having a core of Cu or Au about 10 to 30 μm in size, and has an AuSn eutectic layer on the lower face thereof.

Each of the leadframes 11 and 12 is formed from a copper plate plated with Ni, Ag, Au, or the like, and has a thickness of 100 to 400 μm. The gap 19 formed between the leadframes 11 and 12 is 200 to 400 μm in width. The LED die 14 is flip-chip mounted on the upper surfaces (first surfaces) of the leadframes 11 and 12 in such a manner as to straddle the gap 19, while the LED die 15 is flip-chip mounted on the lower surfaces (second surfaces) of the leadframes 11 and 12 in such a manner as to straddle the gap 19. The protruding electrodes 18 are rearranged on the bottom faces of the respective LED dies 14 and 15 so as to match the pitch. With the above arrangement, the LED dies 14 and 15 are placed with their designated portions facing each other.

Of the portions of the leadframes 11 and 12, the portions (cut faces) exposed to the outside environment should be plated with solder or the like. If the surfaces of the leadframes 11 and 12 are plated with Ag, then an inorganic transparent insulating film such as SiO2 should be formed over the entire surface of each of the leadframes 11 and 12, except the mounting portions thereof, in order to prevent oxidation or sulfidization. Further, the protruding electrodes 18 should be connected to the leadframes 11 and 12 by AuSn eutectic or by a high-melting solder in order to prevent the connections from being melted at the reflow temperature applied when mounting the LED device 10 on a mother substrate. The covering member 13 is formed from a silicone resin containing phosphors.

Figure 3:
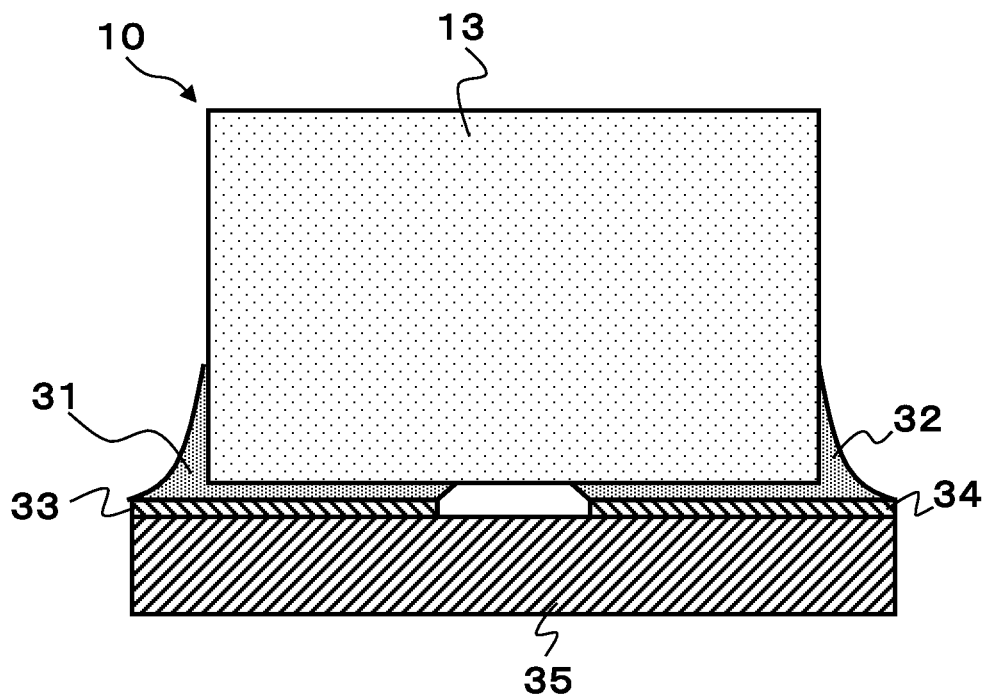
FIG. 3 is a diagram showing the LED device 10 mounted on a mother substrate 35.

FIG. 3 is a diagram showing the LED device 10 mounted on a mother substrate 35.

FIG. 3 shows the LED device 10 as viewed from the front side. Mother substrate electrodes 33 and 34 are formed on the mother substrate 35. The mother substrate electrode 33 is connected to the leadframe 11 (see FIGS. 1 and 2) by a solder 31. Similarly, the mother substrate electrode 34 is connected to the leadframe 12 (see FIGS. 1 and 2) by a solder 32. The solders 31 and 32 may each be formed not only on the bottom face of the LED device 10 but also halfway along the side face in order to increase the strength of the connection. The gap between the mother substrate electrodes 33 and 34 is made wider than the gap 19 (see FIG. 2) in the LED device 10 in order to avoid short-circuiting due to the presence of foreign matter.

Figure 4:
FIGS. 4(a) to 4(f) are diagrams (part 1) for explaining a fabrication method for the LED device 10.
Figure 4:
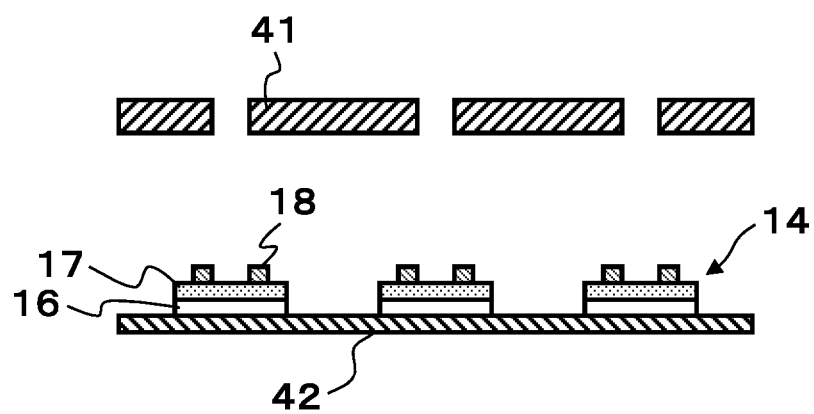
Figure 4:
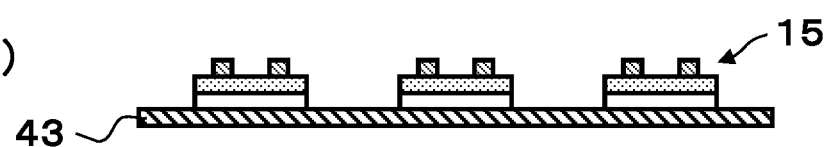
Figure 4:
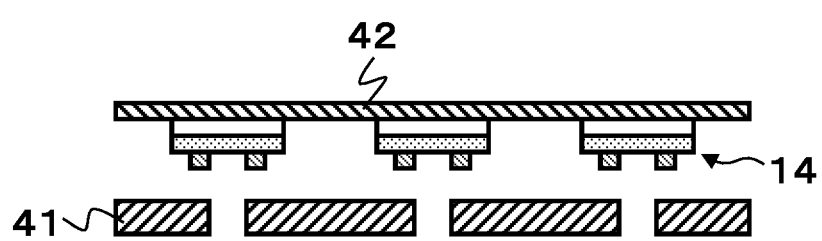
Figure 4:
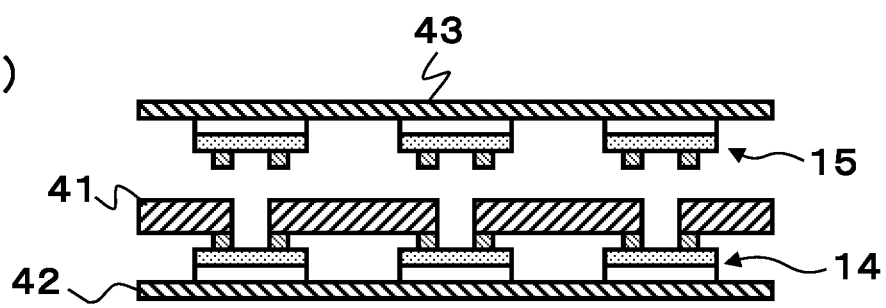
Figure 4:
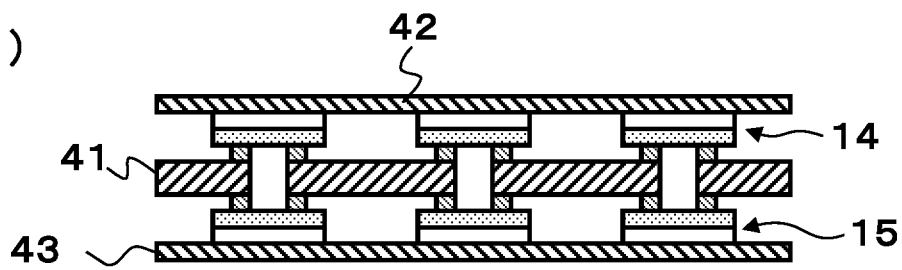
Figure 5:
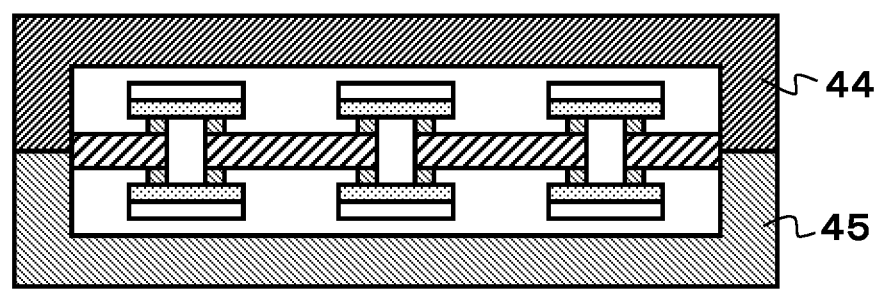
FIGS. 5(g) to 5(i) are diagrams (part 2) for explaining the fabrication method for the LED device 10.
Figure 5:
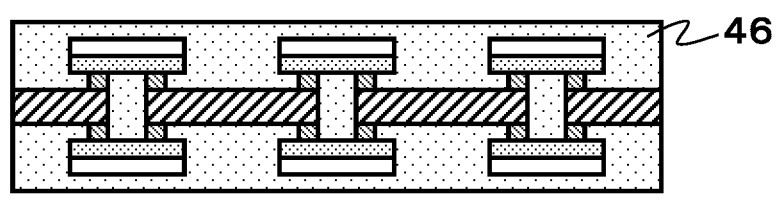
Figure 5:
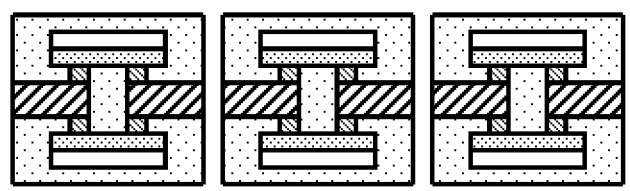

FIGS. 4 and 5 are diagrams for explaining a fabrication method for the LED device 10.

First, a large-sized leadframe 41 from which the leadframes 11 and 12 to be included in each individual LED device 10 (see FIGS. 1 and 2) are diced is prepared (large-sized leadframe preparation step) (see FIG. 4(a)). The large-sized leadframe 41 is a plate-like member on which a large number of LED dies 14 and 15 can be mounted, but for illustrative purposes, FIGS. 4 and 5 show that only three of each of the LED dies 14 and 15 can be mounted (the same applies hereinafter). The large-sized leadframe 41 is prepared by etching a copper plate and forming openings in the desired positions, and the surface is plated after the etching.

Next, the plurality of LED dies 14 are placed on a first adhesive sheet 42 (first placement step) (see FIG. 4(b)). The first adhesive sheet 42 is formed by forming an adhesive layer on the upper surface of a polyimide sheet. The LED dies 14 are picked up one at a time by a picker and placed one by one on the first adhesive sheet 42. The LED dies 14 are placed with their top faces facing down (shown upside down in the figure) and bonded to the first adhesive sheet 42. The LED dies 14 are arranged at the same pitch as the pitch of the mounting portions of the large-sized leadframe 41. Further, each LED die 14 is oriented so that the anode and cathode are located at the desired positions.

Next, the plurality of LED dies 15 are placed on a second adhesive sheet 43 (second placement step) (see FIG. 4(c)). In the second placement step, the plurality of LED dies 15 are placed on the second adhesive sheet 43 in a manner similar to the first placement step shown in FIG. 4(b). The surface of the large-sized leadframe 41 onto which the second adhesive sheet 43 is laminated is opposite from the surface of the large-sized leadframe 41 onto which the first adhesive sheet 42 is laminated. The large-sized leadframe preparation step, the first placement step, and the second placement step need not necessarily be performed in the above-described order.

Next, the first adhesive sheet 42 on which the plurality of LED dies 14 have been placed is positioned with respect to the large-sized leadframe 41 (first positioning step) (see FIG. 4(d)). The first adhesive sheet 42 is turned upside down, and is positioned accurately while observing the large-sized leadframe 41 through the optically transmissive first adhesive sheet 42. When the positioning is complete, the first adhesive sheet 42 is tentatively fixed at the edges of the large-sized leadframe 41.

Next, the second adhesive sheet 43 on which the plurality of LED dies 15 have been placed is positioned with respect to the large-sized leadframe 41 (second positioning step) (see FIG. 4(e)). The large-sized leadframe 41 to which the first adhesive sheet 42 has been tentatively fixed is turned upside down. At this time, the first adhesive sheet 42 is in contacting relationship with the large-sized leadframe 41. Similarly to the first positioning step, the second adhesive sheet 43 is turned upside down, and is positioned accurately while observing the large-sized leadframe 41 through the second adhesive sheet 43. When the positioning is complete, the second adhesive sheet 43 is tentatively fixed at the edges of the large-sized leadframe 41.

Then, the first and second adhesive sheets 42 and 43 and the large-sized leadframe 41 are pressed together under heat, thus connecting the LED dies 14 and 15 to the large-sized leadframe 41 (connecting step) (see FIG. 4(f)). FIG. 4(f) shows the structure upside down from that shown in FIG. 4(e). The large-sized leadframe 41 to which the first and second adhesive sheets 42 have been tentatively fixed is placed on a table (not shown), and the first and second adhesive sheets 42 and the large-sized leadframe 41 are pressed together by using a pressing head (not shown). While maintaining the pressure, the pressing head is heated to a temperature of about 300 to 350° C. Since the AuSn eutectic melts at this temperature, the temperature of the pressing head is lowered after a predetermined time has elapsed and, after that, the pressing head is removed from the large-sized leadframe 41, etc.

Next, the first and second adhesive sheets 42 and 43 are removed from the large-sized leadframe 41 to which the LED dies 14 and 15 have been connected, and the leadframe 41 is placed into a pair of mold halves 44 and 45 (covering step) (see FIG. 5(g)). Though not shown here, the edges of the large-sized leadframe 41 are supported by the mold halves 44 and 45. If the supporting is not sufficient, a supporting structure may be provided within the mold 44, 45. After the large-sized leadframe 41 has thus been placed into the mold, a covering member 46 is formed by injection molding.

After that, the large-sized leadframe 41 is removed from the mold 44, 45 (see FIG. 5(h)).

Finally, the large-sized leadframe 41 is diced into individual LED devices 10 (dicing step) (see FIG. 5(i)). The large-sized leadframe 41 covered as described above is attached to a dicing sheet (not shown), and the large-sized leadframe 41 is cut by a dicer to separate each individual LED device 10.

Figure 6:
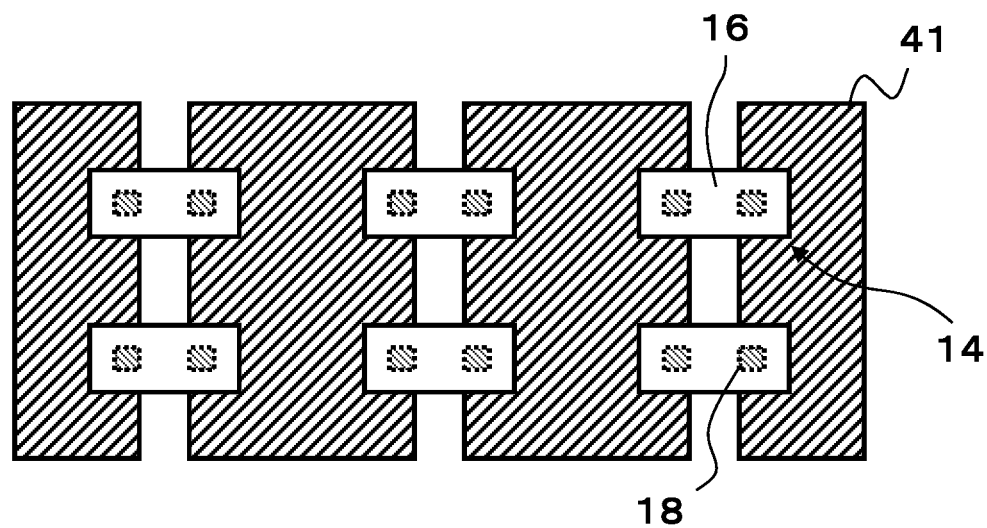
FIG. 6 is a plan view showing the positional relationship between a large-sized leadframe and LED dies.

FIG. 6 is a plan view showing the positional relationship between the large-sized leadframe and the LED dies.

FIG. 6 shows a portion of the large-sized leadframe 41 as viewed from the top by removing the covering member 46 in FIG. 5(h). On the large-sized leadframe 41, the LED dies 14 are arranged in a lattice pattern. The large-sized leadframe 41 is shown as if it is constructed from an array of copper plates each extending vertically in the figure. Though not shown here, the copper plates are actually connected together at their upper or lower ends. In the figure, the protruding electrodes 18 located on the other side of the sapphire substrate 16 are indicated by dotted lines.

Second Embodiment

In the LED device 10 described above, light is also emitted in a direction parallel to the leadframes 11 and 12. Depending on the application of the LED device 10, this emitted light may not only be difficult to utilize but also be detrimental. For example, in the LED device 10, if the distance that the light emitted in the direction vertical to the leadframes 11 and 12 travels through the covering member 13 differs from the distance that the light emitted in the horizontal direction travels through the covering member 13, the amount of wavelength conversion that the light undergoes while passing through the phosphors becomes different. As a result, in the LED device 10, the color of the emitted light may be different depending on the direction in which it is emitted. In view of this, the following description deals with an LED device (semiconductor light emitting device) 70 which does not emit light in the direction parallel to the leadframes 11 and 12 but emits light only in the direction vertical to the leadframes 11 and 12. In the LED device 70, the same component elements as those of the LED device 10 are designated by the same reference numerals.

Figure 7:
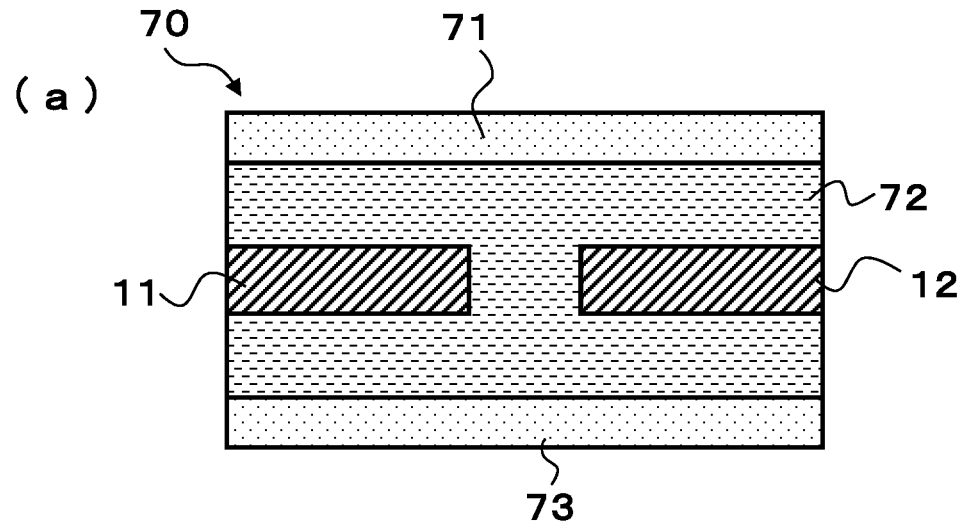
FIG. 7 is a diagram showing the external appearance of an LED device 70: part (a) is a top plan view, (b) is a front view, and (c) is a right side view.
Figure 7:
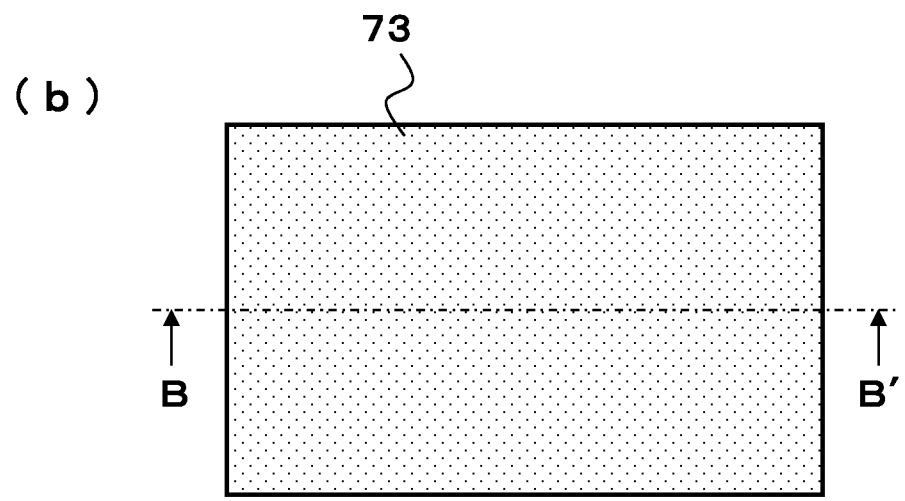
Figure 7:
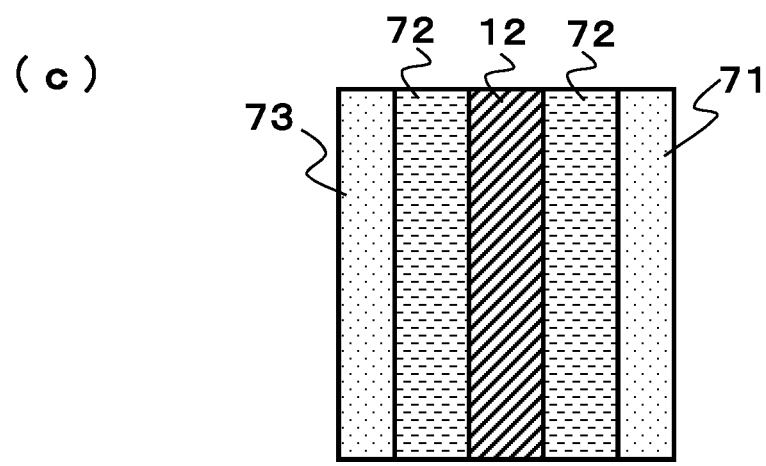

FIG. 7 is a diagram showing the external appearance of the LED device 70: part (a) is a top plan view, (b) is a front view, and (c) is a right side view.

When the LED device 70 is viewed from the top, phosphor sheets 71 and 73 and a reflective member 72 sandwiched between the phosphor sheets 71 and 73 are seen in addition to the leadframe 11 (first leadframe) and leadframe 12 (second leadframe) extending horizontally in the reflective member 72 (see FIG. 7(a)). The leadframes 11 and 12 are arranged one adjacent to the other with their end portions in close proximity to each other. The other end portions of the leadframes 11 and 12 are flush with the left and right side edges of the phosphor sheets 71 and 73 and the reflective member 72. When the LED device 70 is viewed from the front, only the phosphor sheet 73 is seen (see FIG. 7(b)). When the LED device 70 is viewed from the right side, the phosphor sheets 71 and 73 and the reflective member 72 sandwiched between the phosphor sheets 71 and 73 are seen in addition to the leadframe 12 embedded in the reflective member 72 (see FIG. 7(c)). Though not shown here, the bottom view of the LED device 70 is the same as the top plan view of FIG. 7(a). The left side view of the LED device 70 is similar to the right side view of FIG. 7(c), except that the leadframe 11 is seen in place of the leadframe 12.

Figure 8:
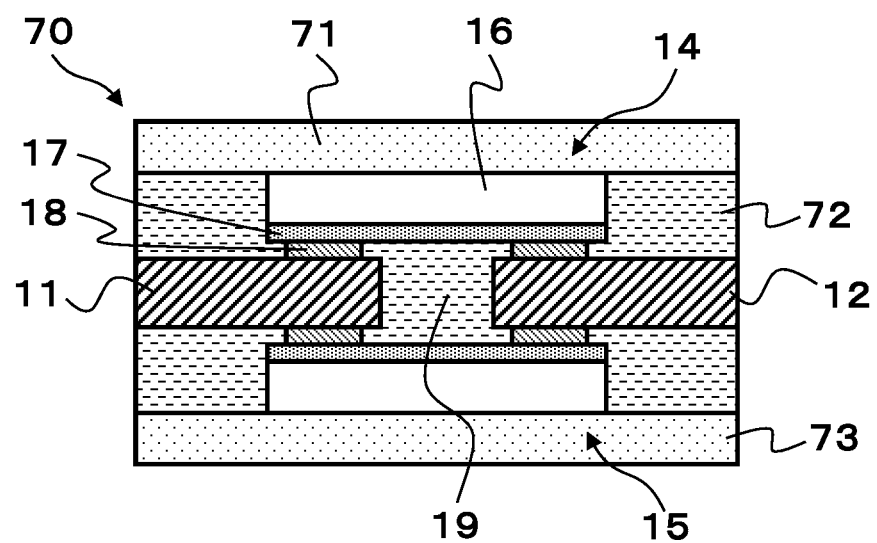
FIG. 8 is a cross-sectional view taken along line BB' in FIG. 7(b).

FIG. 8 is a cross-sectional view taken along line BB' in FIG. 7(b).

The LED device 70 includes the leadframes 11 and 12, the reflective member 72, the phosphor sheets 71 and 73, the LED die 14 (first semiconductor light emitting element), and the LED die 15 (second semiconductor light emitting element). Similarly to the LED device 10 (see FIG. 2), the LED die 14 is flip-chip mounted on the upper surfaces (first surfaces) of the leadframes 11 and 12 in such a manner as to straddle the gap 19. Further, the LED die 15 is flip-chip mounted on the lower surfaces (second surfaces) of the leadframes 11 and 12 in such a manner as to straddle the gap 19. The leadframes 11 and 12 and the LED dies 14 and 15 are the same between the LED device 70 and the LED device 10. The surface treatment of the leadframes 11 and 12 and the connecting structure connecting the LED dies 14 and 15 to the leadframes 11 and 12 are also the same between the LED device 70 and the LED device 10.

The bottom and side faces of the LED dies 14 and 15 are covered with the reflective member 72, while the top faces of the LED dies 14 and 15 are covered with the respective phosphor sheets 71 and 73. That is, in the LED device 70, the reflective member 72 and the phosphor sheets 71 and 73 together constitute the covering member. The reflective member 72 is formed by mixing fine reflective particles such as titanium oxide or alumina into a binder such as a silicone resin or organopolysiloxane, kneading the mixture, and curing the mixture. The phosphor sheets 71 and 73 are each formed by mixing phosphors into a silicone resin, kneading the mixture, and curing the mixture. The phosphor sheets 71 and 73 are bonded to the reflective member 72 and the top faces of the respective LED dies 14 and 15 by a transparent adhesive (not shown).

Figure 9:
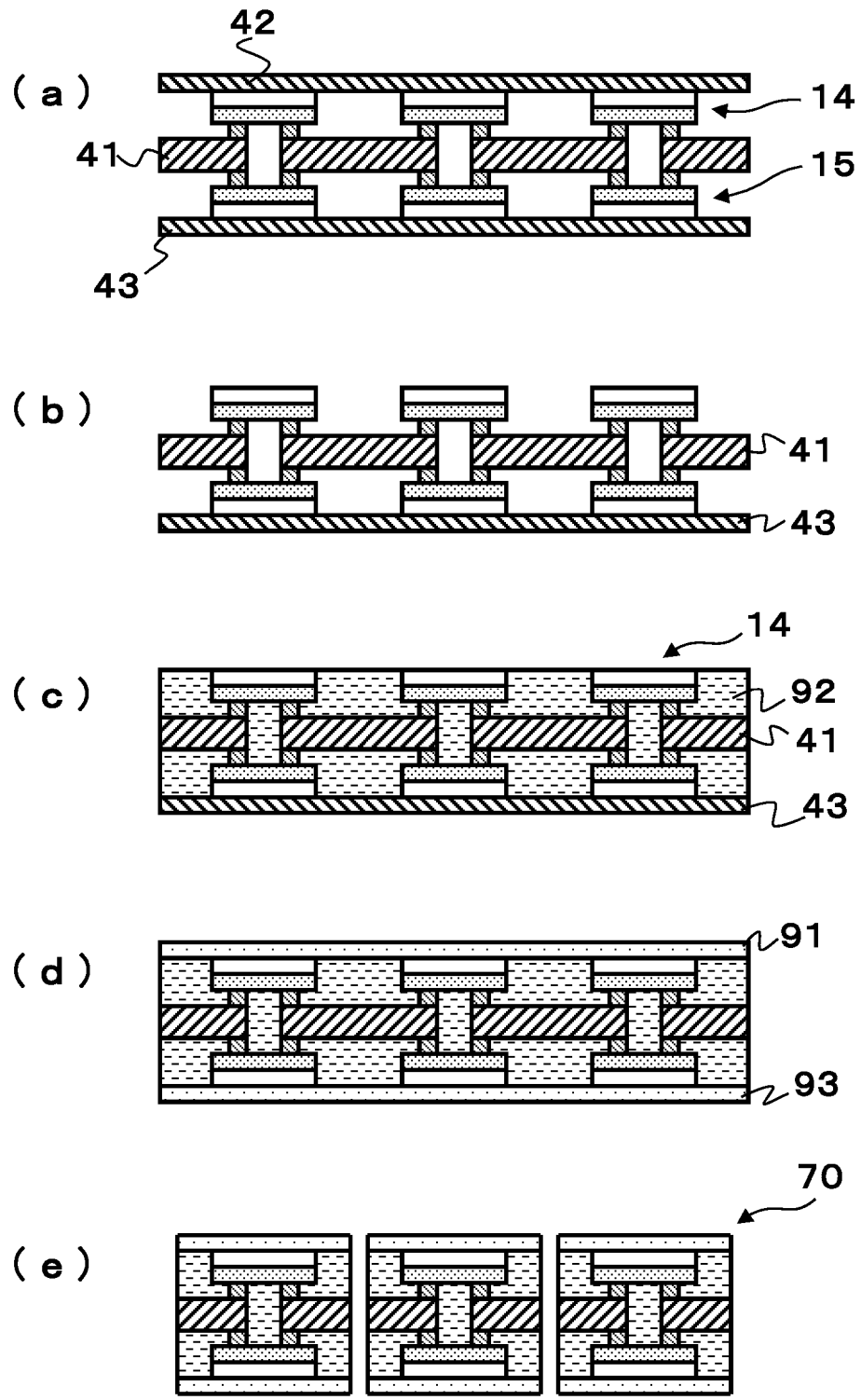
FIG. 9 is a diagram for explaining a fabrication method for the LED device 70.

FIG. 9 is a diagram for explaining a fabrication method for the LED device 70.

The fabrication method of the LED device 70 employs the same steps as the large-sized leadframe preparation step (see FIG. 4(*a*), the first placement step (see FIG. 4(*b*)), the second placement step (see FIG. 4(*c*)), the first positioning step (see FIG. 4(*d*)), the second positioning step (see FIG. 4(*e*)), and the connecting step (see FIG. 4(*f*)) shown in the fabrication method of the LED device 10, and therefore, the description of these steps will not be repeated here.

FIG. 9(*a*) is the same diagram as that shown in FIG. 4(*f*), and shows the starting step (initial condition) of the process that characterizes the fabrication method of the LED device 70.

From the condition shown in FIG. 9(*a*), only the first adhesive sheet 42 is removed (first substep) (see FIG. 9(*b*)). FIGS. 9(*b*), 9(*c*), and 9(*d*) show three substeps constituting the covering step for covering the LED dies 14 and 15 with a reflective member 92 and phosphor sheets 91 and 93.

Next, the reflective member 92 before curing is filled into the space between the LED dies 14, 15 to cover the bottom and side faces of the LED dies 14, 15 (second substep) (see FIG. 9(*c*)). After filling, the reflective member 92 is cured at about 150° C. The reflective member 92 can be applied using a squeegee, and the portions of the reflective member 92 that remain on the top faces of the LED dies 14 after curing are removed by polishing. Alternatively, the reflective member 92 whose amount is accurately measured using a dispenser may be applied. In that case, there is no need to polish the top faces of the LED dies 14.

Next, the top faces of the LED dies 14 and 15 are covered with the respective phosphor sheets 91 and 93 (third substep) (see FIG. 9(*d*)). A transparent adhesive material is applied over the top faces of the LED dies 14 as well as the upper surface of the reflective member 92, and the phosphor sheet 91 is bonded. In parallel with this substep, the second adhesive sheet 43 is removed, a transparent adhesive material is applied over the top faces of the LED dies 15 as well as the surface (the lower surface in the figure) of the reflective member 92, and the phosphor sheet 93 is bonded. Instead of forming the phosphor sheets 91 and 93, a fluorescent resin prepared by mixing phosphors into a transparent binder such as silicone may be applied over the top faces of the LED dies 14 and 15 as well as the surfaces of the reflective member 92, the resin then being cured to form phosphor layers, and the thus formed phosphor layers may be used as the fluorescent members for covering the top faces of the LED dies 14 and 15. However, when the phosphor sheets 91 and 93 are used as the fluorescent members, the advantage is that the covering step can be accomplished in a short time, because the covering by the reflecting member 92 can be performed concurrently with the preparation of the phosphor sheets 91 and 93.

Finally, the large-sized leadframe 41 covered as described above is diced into individual LED devices 70 (dicing step) (see FIG. 9(*e*)). FIG. 9(*e*) shows the same step as the dicing step of FIG. 5(*i*), except that the covering member used is different.

In the LED devices 10 and 70 described above, the two LED dies 14 and 15 are connected in parallel. In this case, the forward voltage drop of the LED die 14 must be made equal to that of the LED die 15. For example, in the fabrication process, the difference in forward voltage drop is held to within 0.1 V. That is, after dicing the wafer containing a large number of LED dies, the LED dies are sorted out according to the forward voltage drop. If the first and second placement steps are performed while sorting out the LED dies, the pickup job can be standardized, and the fabrication process can be shortened.

In the LED device 70, the side faces of the LED dies 14 and 15 are covered with the reflective member 72, and the phosphor sheets 71 and 73 are bonded to the upper and lower surfaces of the reflective member 72 as well as to the top faces of the respective LED dies 14 and 15 (see FIG. 8) so that the light can be emitted only in the direction vertical to the leadframes 11 and 12. If the light is to be emitted only in the direction vertical to the leadframes 11 and 12, the reflective member may be provided not only on the side faces of the LED dies to which the fluorescent members are laminated but also on the side faces of the fluorescent members laminated to the top faces of the respective LED dies. To fabricate such an LED device, a phosphor layer is formed in advance on the sapphire substrate at the wafer level, and then the wafer is diced into individual LED dies each covered with the phosphor layer. Next, such LED dies are mounted on the large-sized leadframe by using two adhesive sheets, as shown in the fabrication method of the LED device 10. Then, the reflective member is filled into the space surrounding the respective LED dies. Finally, the large-sized leadframe is diced to separate each individual LED device. It is preferable that the binder to be used in the phosphor layer is selected from among transparent inorganic materials such as glass that can withstand the temperature applied when joining the LED dies to the large-sized leadframe.

Third Embodiment

In the LED devices 10 and 70 described above, the cut faces of the leadframes 11 and 12 are made flush with the cut faces of the covering member 13 (the reflective member 72 in the case of the LED device 70). When mounting the LED device 10 or 70 on a mother substrate, if the strength is not sufficient, the end portions of the respective leadframes 11 and 12 may be made to protrude from the respective cut faces of the covering member 13 (the reflective member 72 in the second embodiment). The following description therefore deals with an LED device (semiconductor light emitting device) 100 in which the leadframes 11 and 12 are made to extend (protrude) horizontally from the covering member. In the LED device 100, the same component elements as those of the LED device 10 are designated by the same reference numerals.

Figure 10:
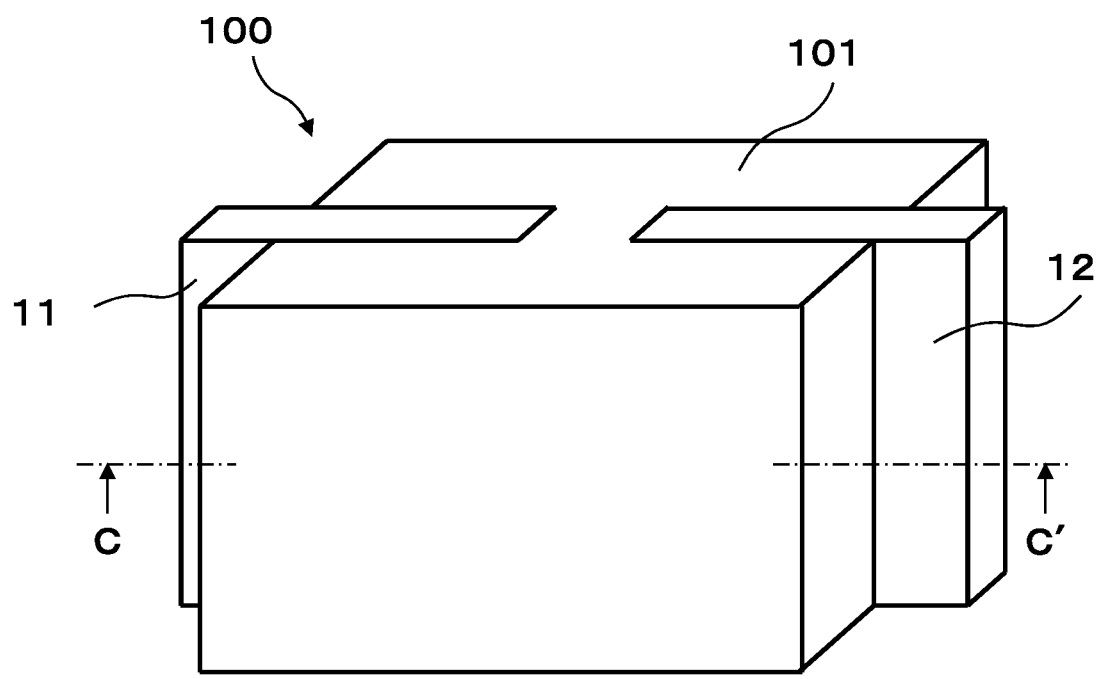
FIG. 10 is a diagram showing the external appearance of an LED device 100: part (a) is a perspective view, and (b) is a cross-sectional view taken along line CC' in (a).
Figure 10:
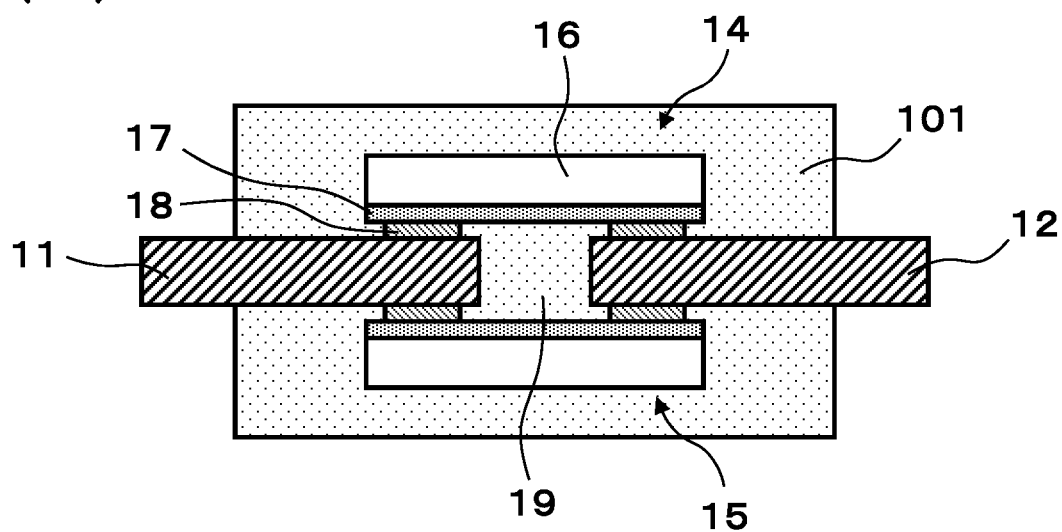

FIG. 10 is a diagram showing the external appearance of the LED device 100: part (a) is a perspective view, and (b) is a cross-sectional view taken along line CC' in (a).

The LED device 100 is identical to the LED device 10, except that the left and right end portions of the respective leadframes 11 and 12 are made to protrude from the covering member 101. That is, in the LED device 100, the two flat plate-like leadframes 11 and 12 are embedded in the covering member 101, and the left and right end portions of the respective leadframes protrude from the covering member 101. As shown, the upper edge faces of the leadframes 11 and 12 are flush with the upper face of the covering member 101, and similarly, the lower edge faces of the leadframes 11 and 12 are flush with the lower face of the covering member 101. The LED dies 14 and 15 are flip-chip mounted on the upper and lower surfaces of the leadframes 11 and 12 in such a manner as to straddle the gap between the leadframes. The covering member 101 is formed from a fluorescent resin prepared by mixing phosphors into a silicone resin and curing the mixture. The leadframes 11 and 12 and the LED dies 14 and 15 are the same between the LED device 100 and the LED device 10. The surface treatment of the leadframes 11 and 12 and the connecting structure connecting the LED dies 14 and 15 to the leadframes 11 and 12 are also the same between the LED device 100 and the LED device 10.

The fabrication method of the LED device 100 is such that, after completing the fabrication of the large-sized leadframe 41 covered with the covering member 46 as shown in FIG. 5(h) for the LED device 10, the covering member 46 is partially removed by cutting or the like so as to expose the large-sized leadframe in the desired positions, thus forming the covering member 101. After that, the large-sized leadframe 41 is diced while leaving the protruding portions exposed, to complete the fabrication of the LED device 100.

In the LED device 100, the protruding portions of the leadframes 11 and 12 may be bent to conform to the side faces of the LED device 100. Further, in the LED device 10, the LED dies 14 and 15 have been described as being connected to the leadframes 11 and 12 by AuSn eutectic, but instead, a high-melting solder may be used to connect them. The high-melting solder used here is an alloy having a higher melting point than the solder used to mount the LED device to the mother substrate.

Figure 11:
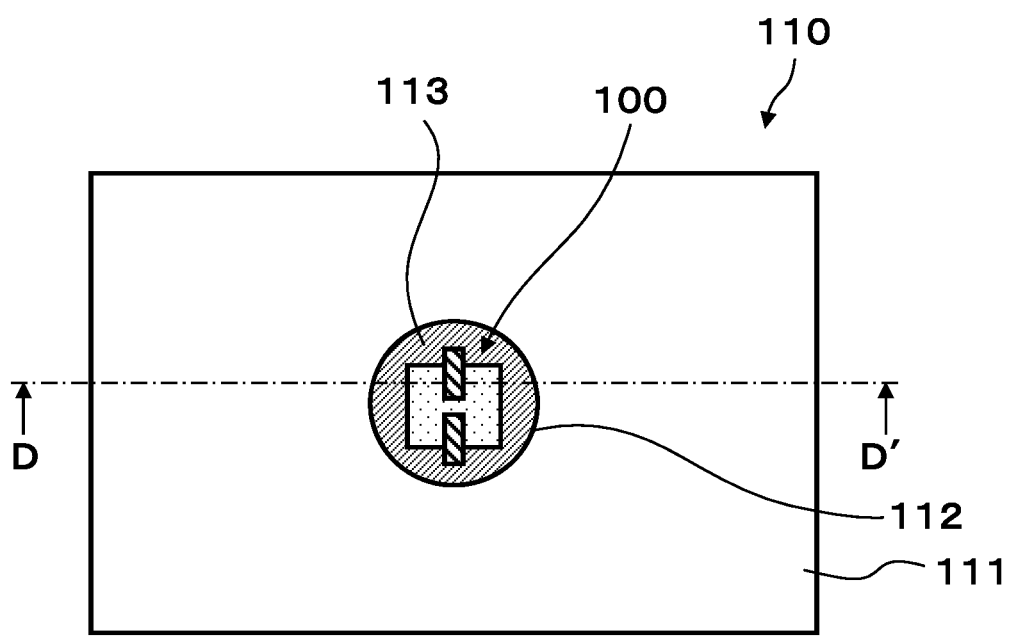
FIG. 11 is a diagram showing an application example in which the LED device (semiconductor light emitting device) 100 is used in an area lighting device 110: part (a) is a plan view, and (b) is a cross-sectional view taken along line DD' in (a).
Figure 11:
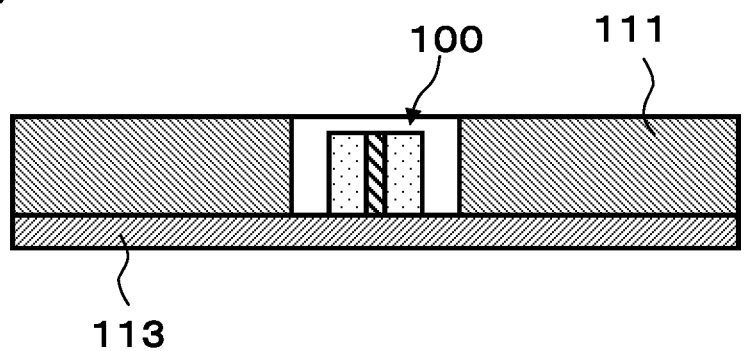

FIG. 11 is a diagram showing an application example in which the LED device 100 is used in an area lighting device 110: part (a) is a plan view, and (b) is a cross-sectional view taken along line DD' in (a).

As shown in FIG. 11(a), the area lighting device 110 includes a light conducting plate 111 having an opening 112, and the LED device 100 is mounted in the opening 112. The LED device 100 is connected electrically and mechanically to a mounting substrate 113 disposed under the light conducting plate 111. A portion of the surface of the mounting substrate 113 is exposed in the opening 112.

In the area lighting device 110, the light emitted from the LED device 100 in the left and right directions in the figure is introduced into the light conducting plate 111. While propagating through the light conducting plate 111, the direction of propagation of the introduced light is changed by the diffusing particles contained in the light conducting plate 111, and the light emerges from the upper surface of the light conducting plate 111. Any portion of the light directed toward the lower surface of the mounting substrate 113 is redirected upward by being reflected by a reflective layer provided on the upper surface of the mounting substrate 113 or on the lower surface of the light conducting plate 111. While the light conducting plate 111 of the area lighting device 110 has been described as being provided with only one opening 112, the light conducting plate 111 may be provided with a plurality of openings, and the LED device 100 may be mounted in each opening.

Fourth Embodiment

In the LED device 100, since the covering member 101 consists only of the fluorescent resin, light is emitted from all the faces of the LED device 100. In this case, the optical path length that the light travels through the fluorescent resin constituting the covering member 101 differs between the light emitted from the front face and the light emitted from the side face, and a difference may arise in the amount of wavelength conversion that the light undergoes while passing through the fluorescent resin. This leads to the problem that, in the LED device 100, the color of the light emitted from the front face differs from the color of the light emitted from the side face. The following description therefore deals with an LED device (semiconductor light emitting device) 120 in which the light emitting faces are limited to the front and back faces. In the LED device 120, the same component elements as those of the LED device 10 are designated by the same reference numerals.

Figure 12:
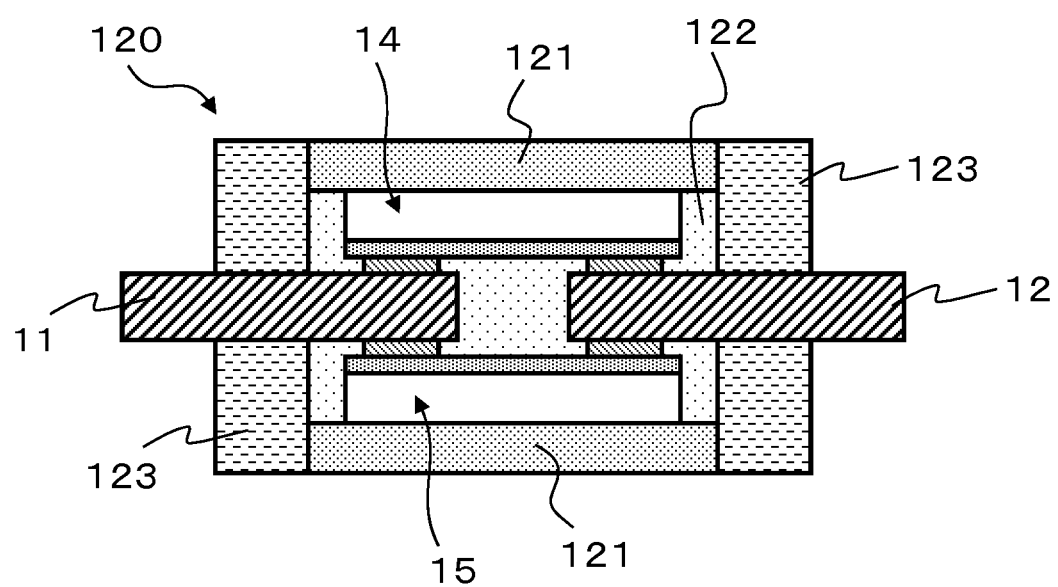
FIG. 12 is a cross-sectional view of an LED device 120.

FIG. 12 is a cross-sectional view of the LED device 120.

The external appearance of the LED device 120 is the same as that of the LED device 100 shown in FIG. 10(a); therefore, the cross-sectional view of the LED device 120 shown in FIG. 12 corresponds to the cross-sectional view taken along line CC' in FIG. 10(a). The difference between the LED device 120 and the LED device 100 is that, in the LED device 120, the covering member comprises a plurality of members. In the LED device 120, the covering member comprises a fluorescent resin 122 filled so as to cover the side faces and bottom faces of the LED dies 14 and 15 mounted on the two flat plate-like leadframes 11 and 12, phosphor sheets 121 covering the top faces of the respective LED dies 14 and 15 as well as the fluorescent resin 122, and a frame-like reflective member 123 formed so as to surround the fluorescent resin 122 and the phosphor sheets 121. In each of the LED dies 14 and 15, the top face refers to the face located on the sapphire substrate 16 side.

The fabrication method of the LED device 120 is such that, after mounting the LED dies 14 and 15 on the respective surfaces of the large-sized leadframe 41 as shown in FIG. 4(f), the fluorescent member 122 is filled into the space between the LED devices (in the left/right and up/down directions in the cross-sectional view) by using a mold or a squeegee, and then the material is cured. Next, the phosphor sheets 121 are laminated onto the fluorescent resin 122 and the sapphire substrates 16 of the top and bottom LED dies 14 and 15. Then, a groove is formed between each LED die so as to expose the large-sized leadframe 41, and a white reflective member is filled into the groove and cured. When the fabrication of the large-sized leadframe 41 thus covered is completed, the white reflective member is partially removed by cutting or the like so as to expose the large-sized leadframe in the desired positions; after that, the large-sized leadframe 41 is diced while leaving the protruding portions exposed, to complete the fabrication of the LED device 120. The white reflective member remaining after dicing is the reflective member 123 of the LED device 120.

In the LED device 120, the space between the reflective member 123 and the side faces of the LED dies 14 and 15 and the space between the bottom faces of the LED dies 14 and 15 are filled with the fluorescent resin 122. Accordingly, the light emitted from the side face or bottom face of each of the LED dies 14 and 15 undergoes reflection while propagating through the fluorescent resin 122 and emerges from the front face or back face of the LED device 120; in the process, some of the light is wavelength-converted.

In the LED device 70 shown in FIG. 7, since the white reflective member 72 directly covers the side and bottom faces of the LED device 70, the light trying to emerge from the side and bottom faces is reflected back into the LED die 14 or 15. As a result, the light is reabsorbed into the light emitting layer or scattered off as stray light, resulting in light emission loss. By contrast, in the LED device 120, since most of the light emitted from the side and bottom faces is not reflected back into the LED die 14 or 15, the light emission efficiency increases. Furthermore, the wavelength-converted light, if reflected back into the LED die 14 or 15, is not reabsorbed into the light emitting layer. This also contributes to increasing the light emission efficiency. If the wavelength converting function is not needed in the covering member, the fluorescent resin 122 used as the covering member may be replaced by a transparent member. However, in this case, the light emission efficiency slightly drops.

In the LED device 120, the fluorescent resin may be used in place of the phosphor sheets 121 covering the top faces of the LED dies 14 and 15. In that case, the phosphor sheet laminating step can be omitted. In the fabrication method of the LED device 120 described above, if the fluorescent resin 122 remains on the top faces of the LED dies 14 and 15 before laminating the phosphor sheets 121 thereon, it is preferable to remove the remaining fluorescent resin by, for example, polishing the top faces of the LED dies 14 and 15. If the fluorescent resin 122 is used in place of the phosphor sheets 121 to cover the top faces of the LED dies 14 and 15, this polishing step can also be omitted. On the other hand, since the phosphor sheets 121 are inexpensive, a set of phosphor sheets having different wavelength conversion characteristics may be prepared in advance so that the phosphor sheets that match the light emission characteristics (peak wavelength, etc.) of the LED dies 14 and 15 can be selected as desired from the set. In this way, when the phosphor sheets are used, it becomes easier to manage the color of emission of the LED device.

In the LED device 120, the white reflective member has been formed in a frame-like shape. However, the method of limiting the light emitting faces is not limited to providing a frame-like reflective member. For example, reflective members may be formed using the white reflective member only on the top and bottom faces of the LED device 120 (in the cross-sectional view, in the direction vertical to the plane of the figure) so that the light can be emitted only from the side faces (in the cross-sectional view, in the direction parallel to the plane of the figure).

Fifth Embodiment

Figure 13:
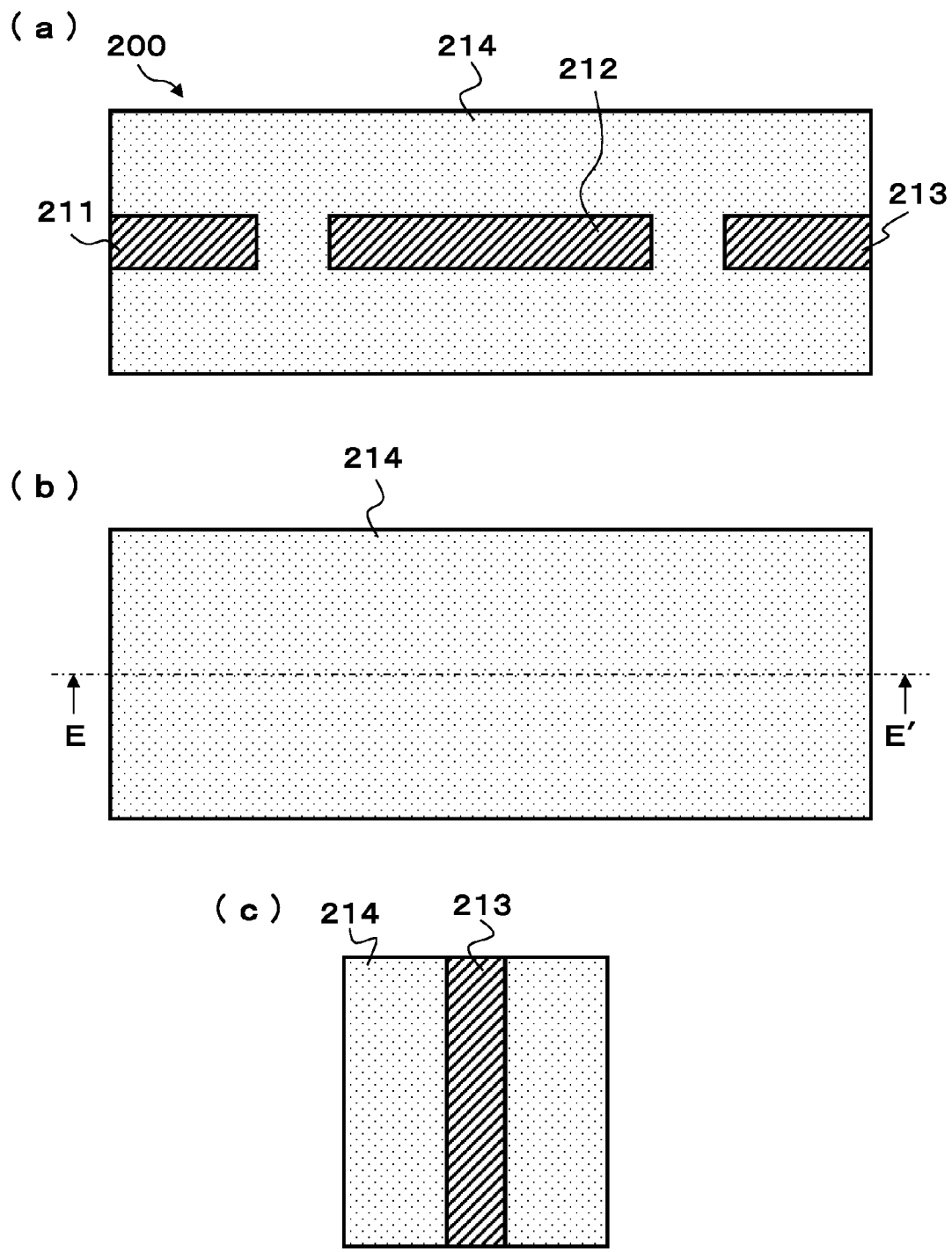
FIG. 13 is a diagram showing the external appearance of an LED device 200: part (a) is a top plan view, (b) is a front view, and (c) is a right side view.

FIG. 13 is a diagram showing the external appearance of an LED device 200: part (a) is a top plan view, (b) is a front view, and (c) is a right side view.

When the LED device (semiconductor light emitting device) 200 is viewed from the top, leadframes 211, 212, and 213 are seen extending horizontally in a rectangular covering member 214 (see FIG. 13(a)). The leadframes 211, 212, and 213 are arranged one adjacent another with their end portions in close proximity to each other. The left side edge of the leadframe 211 and the right side edge of the leadframe 213 are flush with the respective side edges of the covering member 214. When the LED device 200 is viewed from the front, only the covering member 214 is seen (see FIG. 13(b)). When the LED device 200 is viewed from the right side, the leadframe 213 is seen extending vertically in such a manner as to split the covering member 214 (see FIG. 13(c)). Though not shown here, the bottom view of the LED device 200 is the same as the top plan view of FIG. 13(a). The left side view of the LED device 200 is similar to the right side view of FIG. 13(c), except that the leadframe 211 is seen in place of the leadframe 213.

Figure 14:
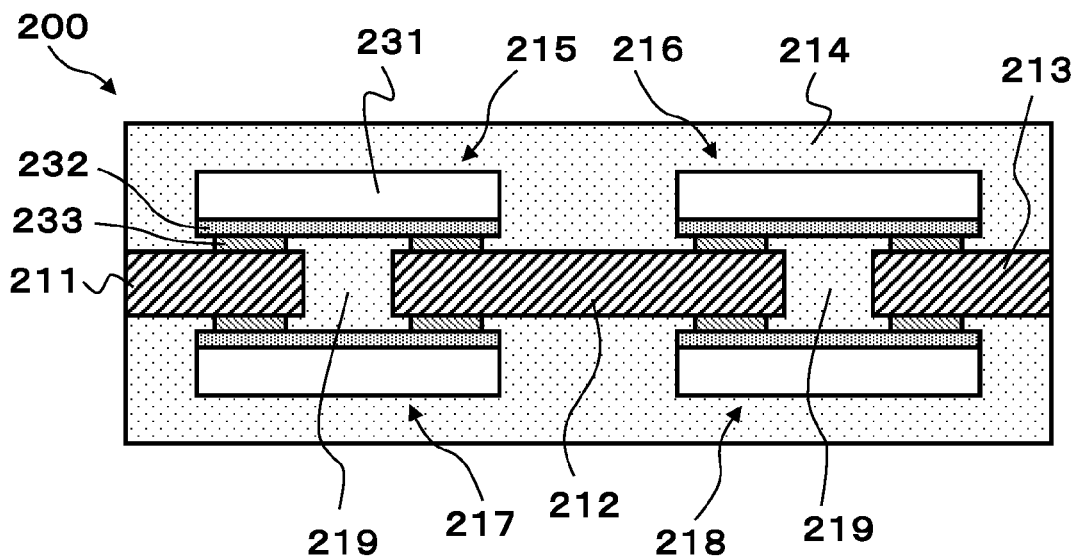
FIG. 14 is a cross-sectional view taken along line EE' in FIG. 13(b).

FIG. 14 is a cross-sectional view taken along line EE' in FIG. 13(b).

The LED device 200 includes LED dies 215, 216, 217 and 218, in addition to the leadframes 211, 212, and 213 and the covering member 214. The LED dies 215 to 218 each comprise a sapphire substrate 231, a semiconductor layer 232, and protruding electrodes 233. In the LED dies 215 to 218, the face on which the semiconductor layer 232 is not formed is called the top face, and the face on which the semiconductor layer 232 and the protruding electrodes 233 are formed is called the bottom face, while the faces connecting between the top and bottom faces are called the side faces.

In the LED dies 215 to 218, the semiconductor layer 232 is formed on the underside of the sapphire substrate 231, and the protruding electrodes 233 are attached to the semiconductor layer 232. The sapphire substrate 231 is a transparent insulating substrate having a thickness of 80 to 120 µm. The semiconductor layer 232 includes an n-type semiconductor layer, a p-type semiconductor layer, an interlayer insulating film, and metal interconnects, and has a thickness slightly smaller than 10 µm. A light emitting layer is formed at the interface between the n-type semiconductor layer and the p-type semiconductor layer, and its plan shape is substantially equal to that of the p-type semiconductor layer. A portion of the n-type semiconductor layer and the p-type semiconductor layer are covered with the interlayer insulating film, and the metal interconnects are formed on the interlayer insulating film. The metal interconnects are connected to the protruding electrodes 233. To facilitate flip-chip mounting, the metal interconnects are clustered into an anode and a cathode, respectively, and are rearranged to form the protruding electrodes 233 on the left and right edge portions of each of the LED dies 215 to 218. Each protruding electrode 233 is formed as a bump having a core of Cu or Au about 10 to 30 µm in size, and has an AuSn eutectic layer on the lower face thereof.

Each of the leadframes 211 to 213 is formed from a copper plate plated with Ni, Ag, Au, or the like, and has a thickness of 100 to 400 µm. The gap 219 formed between the respective leadframes 211 to 213 is 200 to 400 µm in width. The LED die 215 is flip-chip mounted on the upper surfaces (hereinafter called the front surfaces) of the leadframes 211 and 212 in such a manner as to straddle the gap 219. Further, the LED die 216 is flip-chip mounted on the front surfaces of the leadframes 212 and 213 in such a manner as to straddle the gap 219. Similarly, the LED die 217 is flip-chip mounted on the lower surfaces (hereinafter called the back surfaces) of the leadframes 211 and 212 in such a manner as to straddle the gap 219. Further, the LED die 218 is flip-chip mounted on the back surfaces of the leadframes 212 and 213 in such a manner as to straddle the gap 219. The protruding electrodes 233 are rearranged on the bottom face of each of the LED dies 215 to 218 so as to be able to straddle the gap 219 without any problem.

Of the portions of the leadframes 211 to 213, the portions (cut faces) exposed to the outside environment are preferably plated with solder or the like. If the surfaces of the leadframes 211 to 213 are plated with Ag, it is preferable to form an inorganic transparent insulating film such as SiO2 over the entire surface of each of the leadframes 211 to 213, except the mounting portions thereof, in order to prevent oxidation or sulfidization. Further, the protruding electrodes 233 should be connected to the leadframes 11 and 12 by AuSn eutectic as in the present embodiment or by a high-melting solder in order to prevent the connections from being melted at the reflow temperature applied when mounting the LED device 200 on a mother substrate. The covering member 214 is formed from a silicone resin containing phosphors.

Figure 15:
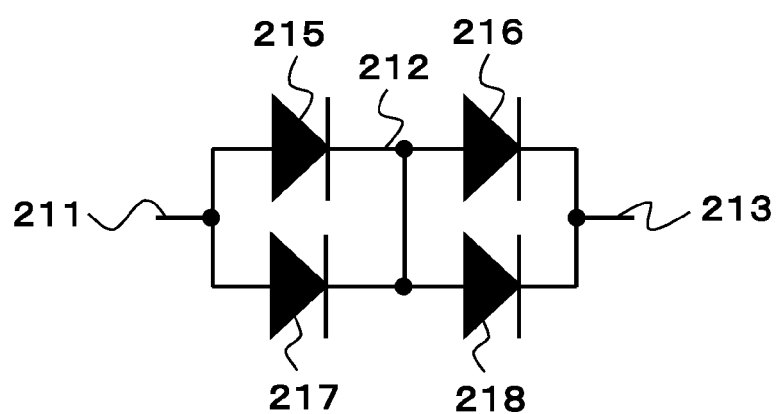
FIG. 15 is a circuit diagram of the LED device 200.

FIG. 15 is a circuit diagram of the LED device 200.

In the LED device 200, the LED dies 215 and 217 are connected in parallel, the LED dies 216 and 218 are also connected in parallel, and the two parallel circuits are connected in series. That is, the LED dies 215 to 218 form a series-parallel circuit, and the anode and cathode of the series-parallel circuit respectively correspond to the leadframes 211 and 213. The intermediate connection corresponds to the leadframe 212.

Figure 16:
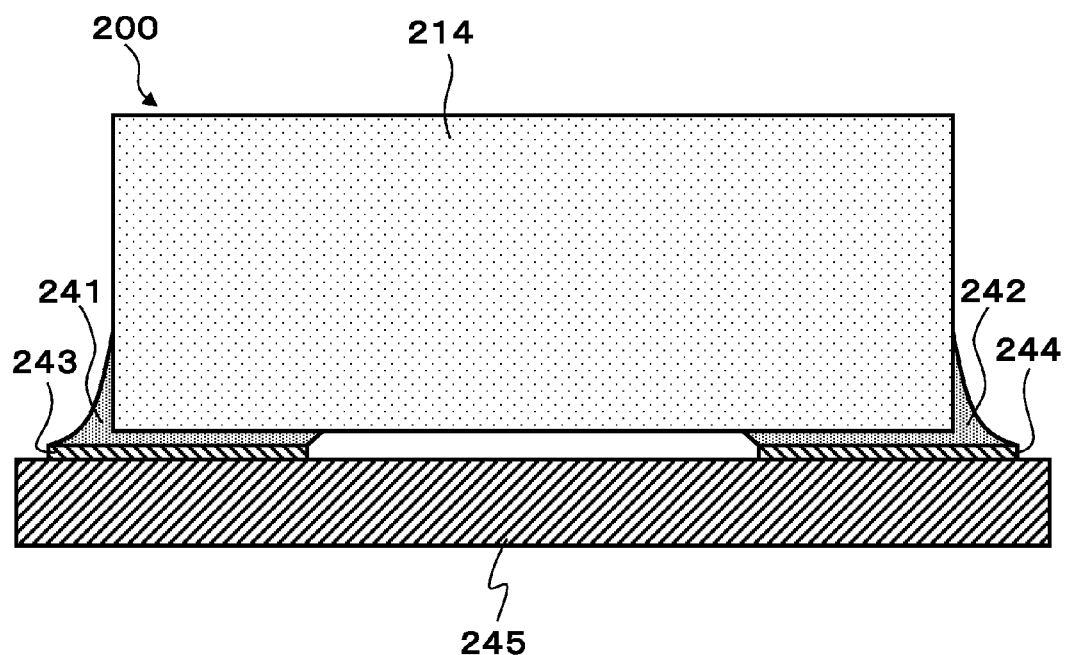
FIG. 16 is a diagram showing the LED device 200 mounted on a mother substrate 245.

FIG. 16 is a diagram showing the LED device 200 mounted on a mother substrate 245.

FIG. 16 shows the LED device 200 as viewed from the front side. Mother substrate electrodes 243 and 244 are formed on the mother substrate 245. The mother substrate electrode 243 is connected to the leadframe 211 (see FIG. 13) by a solder 241. On the other hand, the mother substrate electrode 244 is connected to the leadframe 213 (see FIG. 13) by a solder 242. Preferably, the solders 241 and 242 are each formed not only on the bottom face of the LED device 200 but also halfway along the side face in order to increase the strength of the connection. The gap between the mother substrate electrodes 243 and 244 is made wider than the gap between the leadframes 211 and 213 (see FIG. 13) exposed in the bottom of the LED device 200 in order to avoid short-circuiting due to the presence of foreign matter.

Figure 17:
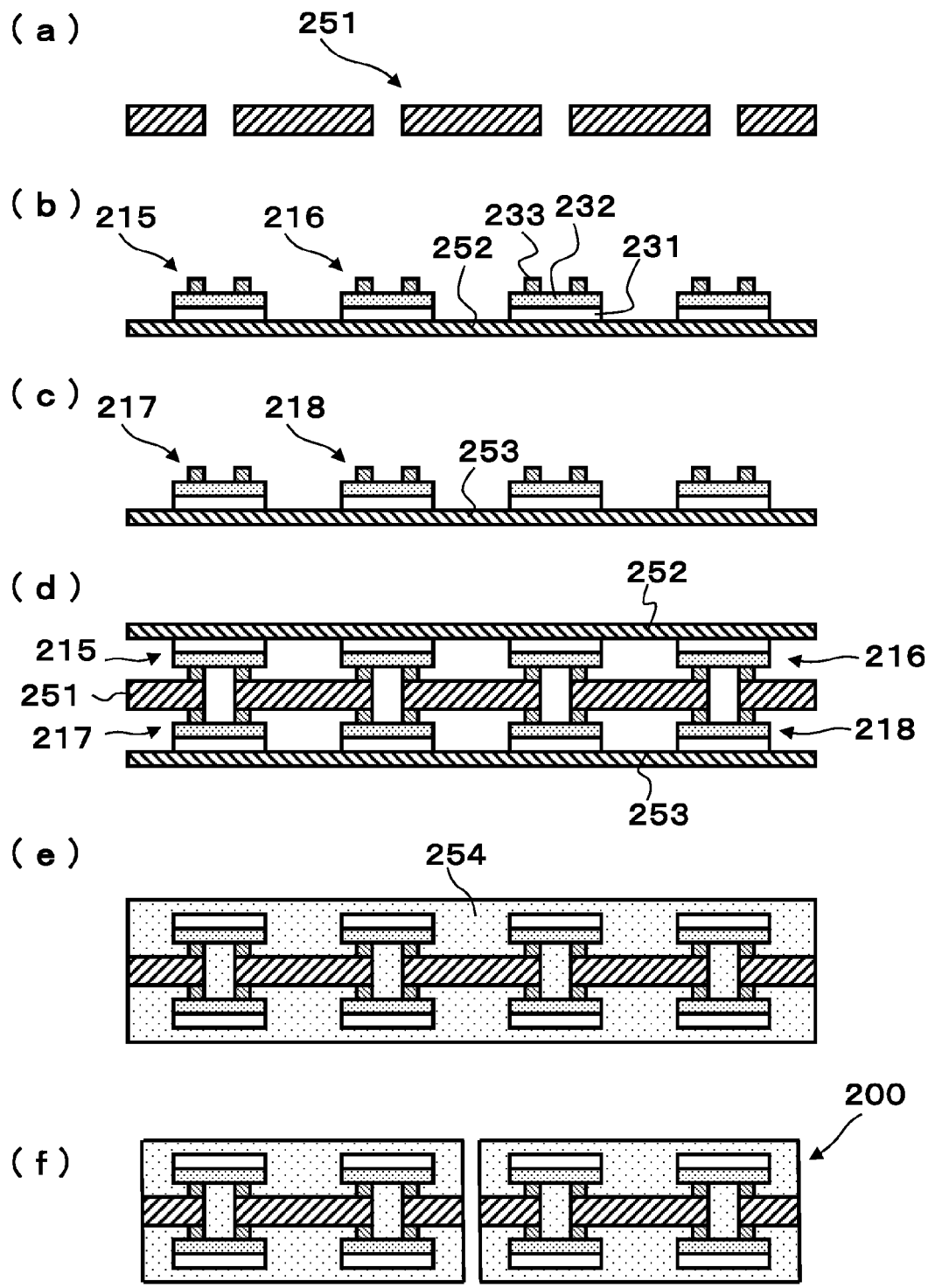
FIG. 17 is a diagram for explaining a fabrication method for the LED device 200.

FIG. 17 is a diagram for explaining a fabrication method for the LED device 200.

First, a large-sized leadframe 251 is prepared (see FIG. 17(a)). The large-sized leadframe 251 is eventually cut apart to obtain the leadframes 211 to 213 (see FIG. 13) to be included in each individual LED 200. The large-sized leadframe 251 is a plate-like member on which a large number of LED dies 215 to 218 can be mounted, but for illustrative purposes, FIG. 17 shows that only two of each of the LED dies 215 to 218 can be mounted (the same applies hereinafter). The large-sized leadframe 251 is prepared by etching a copper plate and forming openings in the desired positions, and the surface is plated after the etching.

Next, the plurality of LED dies 215 and 216 are placed on an adhesive sheet 252 (see FIG. 17(b)). The adhesive sheet 252 is formed by forming an adhesive layer on the upper surface of a polyimide sheet. The LED dies 215 and 216 are picked up one at a time by a picker and placed one by one on the adhesive sheet 252. The LED dies 215 and 216 are placed with their top faces facing down (shown upside down in the figure) and bonded to the adhesive sheet 252. The LED dies 215 and 216 are arranged at the same pitch as the pitch of the mounting portions on the front surface of the large-sized leadframe 251. Further, each of the LED dies 215 and 216 is oriented so that the anode and cathode are located at the desired positions.

Next, the plurality of LED dies 217 and 218 are placed on an adhesive sheet 253 (see FIG. 17(c)). In this step, the plurality of LED dies 217 and 218 are placed on the adhesive sheet 253 in a manner similar to the step shown in FIG. 17(b). The pitch and orientation of the LED dies 217 and 218 are made to match the mounting portions on the back surface of the large-sized leadframe 251. The steps shown in FIGS. 17(a) to 17(c) need not necessarily be performed in the above-described order.

Next, the adhesive sheet 252 on which the plurality of LED dies 215 and 216 have been placed and the adhesive sheet 253 on which the plurality of LED dies 217 and 218 have been placed are positioned with respect to the large-sized leadframe 251, and the adhesive sheets 252 and 253 are the large-sized leadframe 251 are pressed together under heat (see FIG. 17(d)). That is, this step is the step of connecting the LED dies 215 to 218 to the large-sized leadframe 251. The adhesive sheet 252 is turned upside down, and is positioned accurately while observing the large-sized leadframe 251 through the optically transmissive adhesive sheet 252. When the positioning is complete, the adhesive sheet 252 is tentatively fixed at the edges of the large-sized leadframe 252. Next, the large-sized leadframe 252 to which the adhesive sheet 252 has been tentatively fixed is turned upside down. In the same manner as the above positioning step, the adhesive sheet 253 is turned upside down, and is positioned accurately while observing the large-sized leadframe 251 through the adhesive sheet 253. When the positioning is complete, the adhesive sheet 253 is tentatively fixed at the edges of the large-sized leadframe 252. The large-sized leadframe 251 to which the adhesive sheets 252 and 253 have been tentatively fixed is placed on a table, and the adhesive sheets 252 and 253 and the large-sized leadframe 251 are pressed together by using a pressing head; then, while maintaining the pressure, the pressing head is heated to a temperature of about 300 to 350° C. Since the AuSn eutectic melts at this temperature, the temperature of the pressing head is lowered after a predetermined time has elapsed and, after that, the pressing head is removed from the large-sized leadframe 251, etc. In FIG. 17(d), the adhesive sheet 252 is shown at the top to depict the condition after the connections have been made.

Next, the LED dies 215 to 218 are covered with a covering member 254 (see FIG. 17(e)). The adhesive sheets 252 and 253 are removed from the large-sized leadframe 251 to which the LED dies 215 to 218 have been connected, and the LED dies 215 to 218 are covered with the covering member 254. A mold may be used to apply the covering. In that case, after placing the large-sized leadframe 251 into the mold, the covering member 254 is formed by injection molding. FIG. 17(e) shows the large-sized leadframe 251 after the covering.

Finally, the large-sized leadframe 251 is diced into individual LED devices 200 (see FIG. 17(f)). The large-sized leadframe 251 covered as described above is attached to a dicing sheet, and the large-sized leadframe 251 is cut by a dicer to separate each individual LED device 200.

Figure 18:
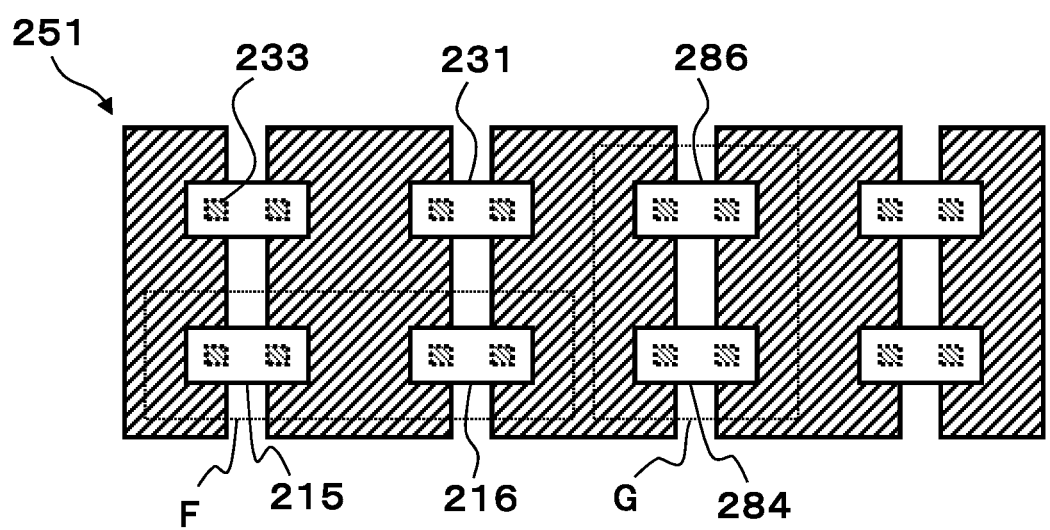
FIG. 18 is a diagram for explaining the positional relationship between a large-sized leadframe 251 and LED dies 215 and 216.

FIG. 18 is a diagram for explaining the positional relationship between the large-sized leadframe 251 and the LED dies 215 and 216.

FIG. 18 is a top plan view showing a portion of the large-sized leadframe 251 as viewed from the top by removing the adhesive sheet 252 in FIG. 17(d). On the large-sized leadframe 251, the LED dies 215 and 216 are arranged in a lattice pattern. The large-sized leadframe 251 is shown as if it is constructed from an array of copper plates each extending vertically in the figure. Though not shown here, the copper plates are actually connected together at their upper or lower ends. In FIG. 18, the protruding electrodes 233 located on the other side of the sapphire substrate 231 are indicated by dotted lines. The LED device 200 is obtained by cutting the portion indicated by F from the large-sized leadframe 251 after the covering. FIG. 18 also shows reference characters 284, 286, and G which are used for the explanation of a sixth embodiment to be described hereinafter.

Sixth Embodiment

In the LED device 200, the LED dies 215 to 218 have been connected in series and parallel. If the brightness of the LED device is to be increased by increasing the number of LED dies, the method of connecting the LED dies need not be limited to a series-parallel connection, but they may be connected in parallel. The following description therefore deals with an LED device (semiconductor light emitting device) 270 in which the LED dies are connected in parallel.

Figure 19:
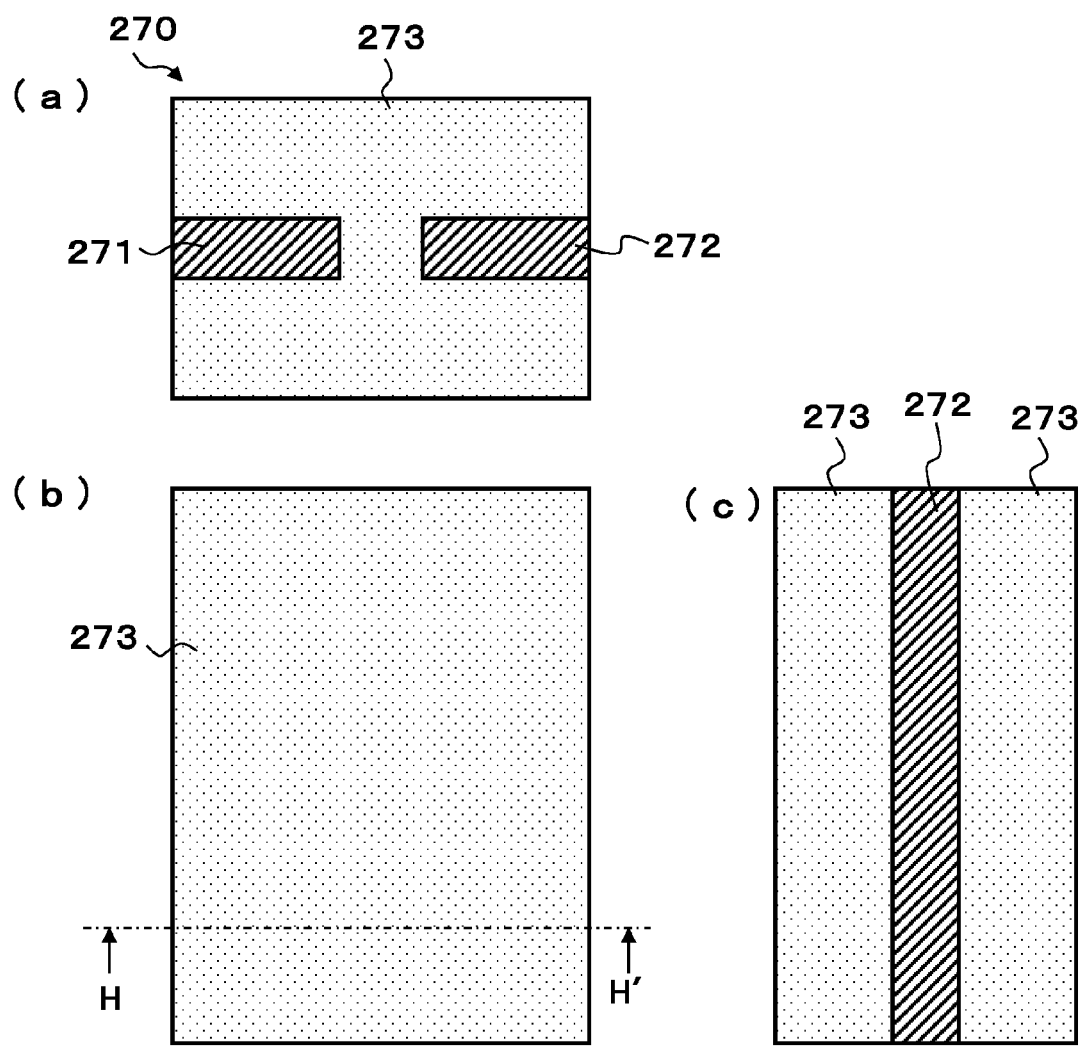
FIG. 19 is a diagram showing the external appearance of an LED device 270: part (a) is a top plan view, (b) is a front view, and (c) is a right side view.

FIG. 19 is a diagram showing the external appearance of the LED device 270: part (a) is a top plan view, (b) is a front view, and (c) is a right side view.

When the LED device 270 is viewed from the top, leadframes 271 and 272 are seen extending horizontally in a rectangular covering member 273 (see FIG. 19(a)). The leadframes 271 and 272 are arranged one adjacent to the other with their end portions in close proximity to each other. The left side edge of the leadframe 271 and the right side edge of the leadframe 272 are flush with the respective side edges of the covering member 273. When the LED device 270 is viewed from the front, only the covering member 273 is seen (see FIG. 19(b)). When the LED device 270 is viewed from the right side, the leadframe 272 is seen extending vertically in such a manner as to split the covering member 273 (see FIG. 19(c)). Though not shown here, the bottom view of the LED device 270 is the same as the top plan view of FIG. 19(a). The left side view of the LED device 270 is similar to the right side view of FIG. 19(c), except that the leadframe 271 is seen in place of the leadframe 272.

Figure 20:
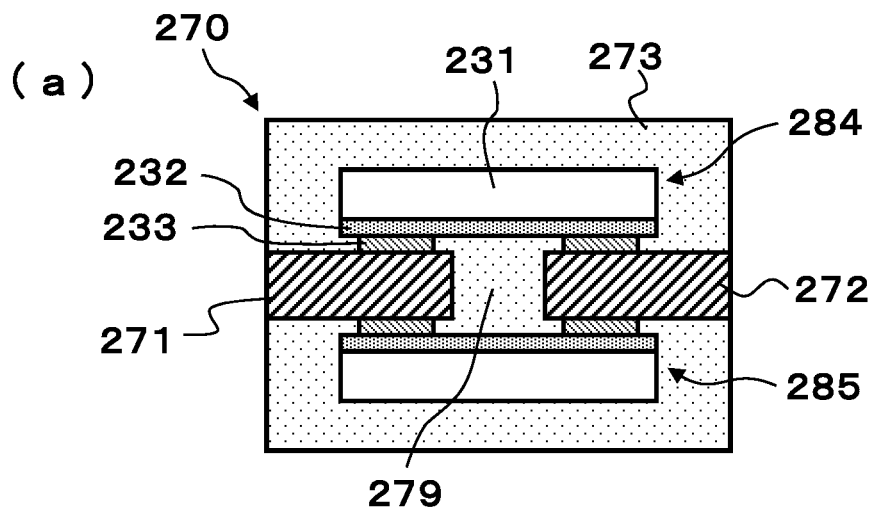
FIG. 20(a) is a cross-sectional view taken along line HH' in FIG. 19(b)
FIG. 20(b) is a front view showing the condition in which a covering member 273 on the front surface side of leadframes 271 and 272 has been removed from the condition shown in FIG. 19(b).
Figure 20:
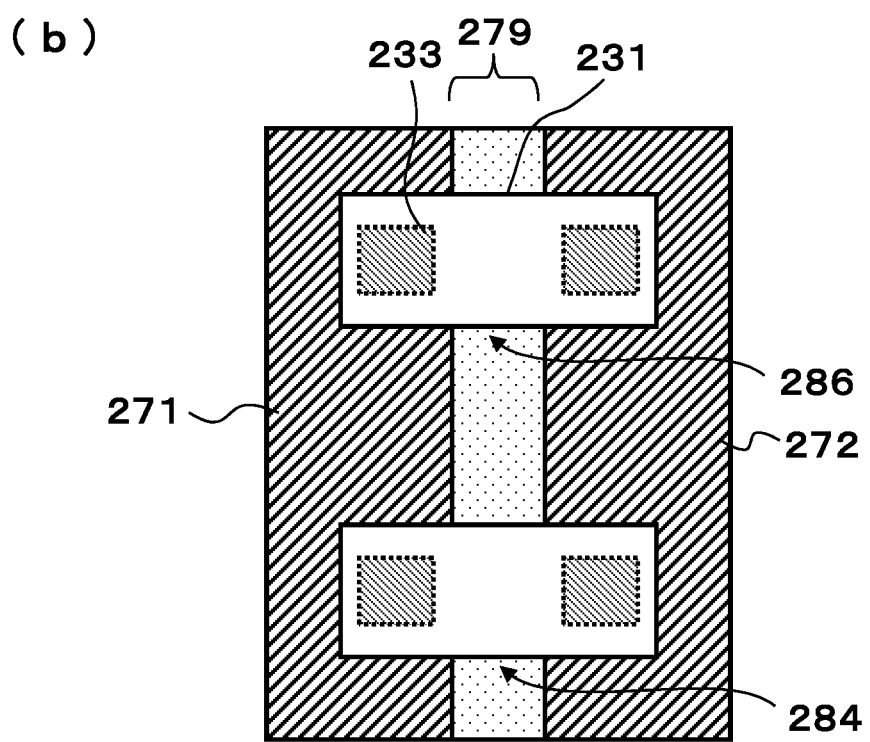

FIG. 20(a) is a cross-sectional view taken along line HH' in FIG. 19(b). FIG. 20(b) is a front view showing the condition in which the covering member 273 on the front surface side of the leadframes 271 and 272 has been removed from the condition shown in FIG. 19(b).

As shown in FIG. 20(a), the LED device 270 includes LED dies 284, 285, 286, and 287, in addition to the leadframes 271 and 272 and the covering member 273. In FIG. 20(a), the LED dies 286 and 287 are not shown because they are occluded by the LED dies 284 and 285, respectively. The LED dies 284 to 287 are the same as the LED dies 215 to 218 contained in the LED device 200, and the leadframes 271 and 272 and the covering member 273 are respectively formed from the same materials as those used for the leadframes 211 to 231 and the covering members 214 in the LED device 200.

As shown in FIG. 20(b), the covering member 273 is seen exposed in a gap 279 created between the vertically extending leadframes 271 and 272. The LED dies 284 and 286 are both connected to the leadframes 271 and 272 in such a manner as to straddle the gap 279. Though not shown here, the LED die 287 is connected on the opposite side of the leadframes 271 and 272 in such a manner as to oppose the LED die 286. The LED device 270 is mounted, with the bottom side of FIG. 20(b) facing down, on a mother substrate in the same manner as the LED device 200 shown in FIG. 16.

Figure 21:
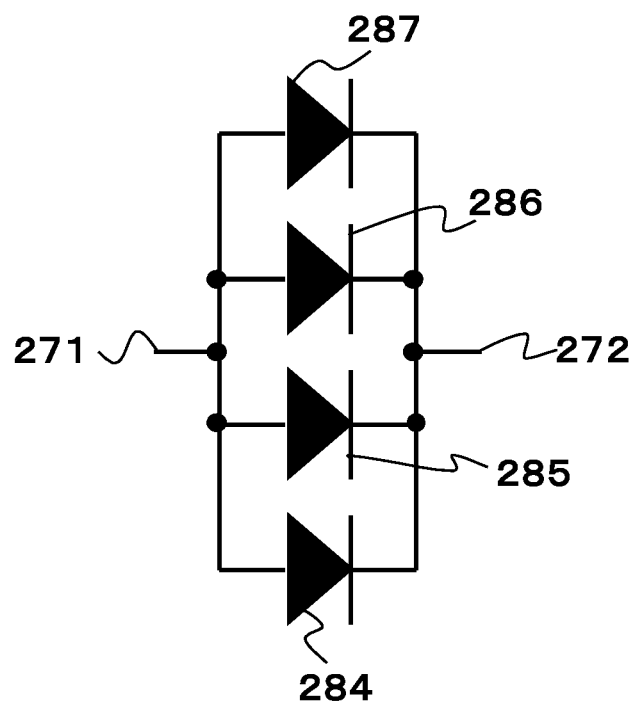
FIG. 21 is a circuit diagram of the LED device 270.

FIG. 21 is a circuit diagram of the LED device 270.

As shown, the LED dies 284, 285, 286, and 287 are connected in parallel. The anode and cathode of the parallel circuit shown in FIG. 21 respectively correspond to the leadframes 271 and 272.

The positional relationship between the large-sized leadframe 251 and the LED dies 284 and 286 will be described with reference to FIG. 18. As earlier described for the LED device 200, FIG. 18 is a top plan view showing a portion of the large-sized leadframe 251 as viewed from the top by removing the adhesive sheet 252 in FIG. 17(d). The LED dies 284 and 286 are arranged in a lattice pattern in such a manner as to straddle the gap between the copper plates. The LED device 270 is obtained by cutting the portion indicated by G from the large-sized leadframe 251 after the covering. That is, the fabrication process for the LED device 270 is the same as that for the LED device 200 up to the step of covering the structure with the covering member, but differs in the way the LED device is cut from the large-sized leadframe 251.

Seventh Embodiment

In the LED devices 200 and 270 described above, light is also emitted in a direction parallel to the leadframes 211 to 213 or the leadframes 271 and 272. Depending on the application of the LED devices 200 and 270, this emitted light may not only be difficult to utilize but also pose a problem. For example, in the LED device 200, the distance that the light emitted in the direction vertical to the leadframes 211 to 213 travels through the covering member 214 may differ from the distance that the light emitted in the horizontal direction travels through the covering member 214. In that case, the amount of wavelength conversion that the light undergoes while passing through the phosphors is different; as a result, the color of the emitted light may be different depending on the direction in which it is emitted. In view of this, the following description deals with an LED device (semiconductor light emitting device) 300 which does not emit light in the direction parallel to the leadframes but emits light only in the direction vertical to the leadframes. In the LED device 300, the same component elements as those of the LED device 200 are designated by the same reference numerals.

Figure 22:
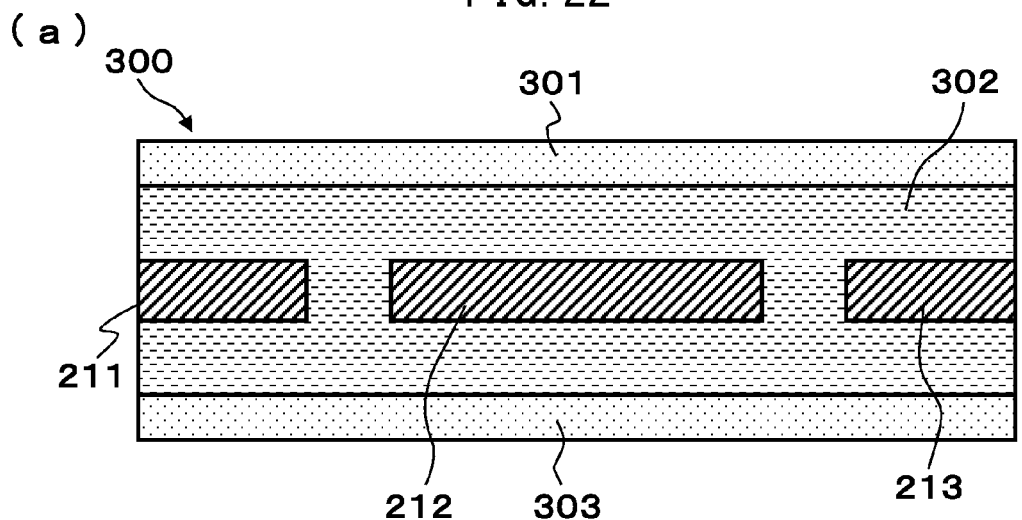
FIG. 22 is a diagram showing the external appearance of an LED device 300: part (a) is a top plan view, (b) is a front view, and (c) is a right side view.
Figure 22:
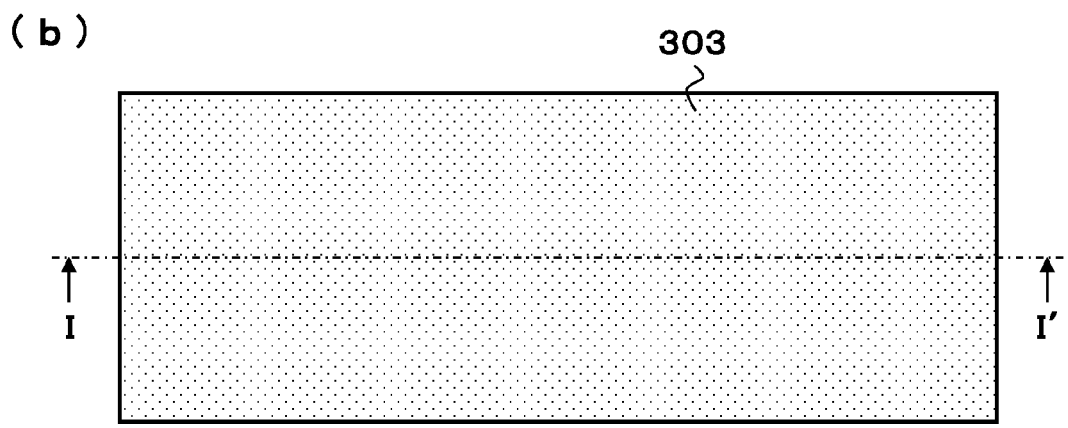
Figure 22:
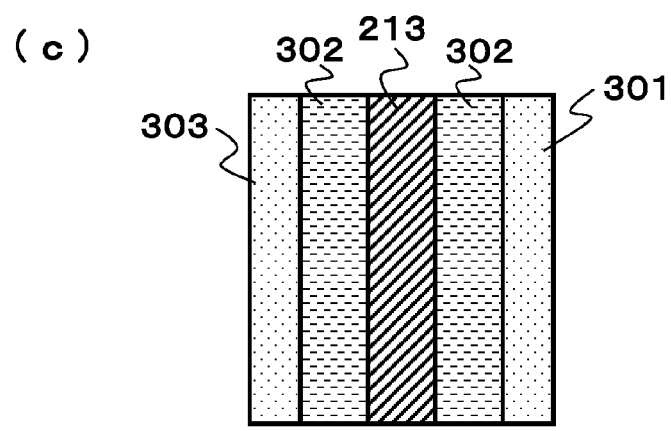

FIG. 22 is a diagram showing the external appearance of the LED device 300: part (a) is a top plan view, (b) is a front view, and (c) is a right side view.

When the LED device 30 is viewed from the top, phosphor sheets 301 and 303 and a reflective member 302 sandwiched between the phosphor sheets 301 and 303 are seen in addition to the leadframes 211, 212, and 213 extending horizontally in the reflective member 302 (see FIG. 22(a)). The leadframes 211, 212, and 212 and 213 are arranged one adjacent another with their end portions in close proximity to each other. The left side edge of the leadframe 211 and the right side edge of the leadframe 213 are respectively flush with the left and right side edges of the phosphor sheets 301 and 303 and the reflective member 302. When the LED device 300 is viewed from the front, only the phosphor sheet 303 is seen (see FIG. 22(b)). When the LED device 300 is viewed from the right side, the phosphor sheets 301 and 303 and the reflective member 302 sandwiched between the phosphor sheets 301 and 303 are seen in addition to the leadframe 213 embedded in the reflective member 302 (see FIG. 22(c)). Though not shown here, the bottom view of the LED device 300 is the same as the top plan view of FIG. 22(a). The left side view of the LED device 300 is similar to the right side view of FIG. 22(c), except that the leadframe 211 is seen in place of the leadframe 213.

Figure 23:
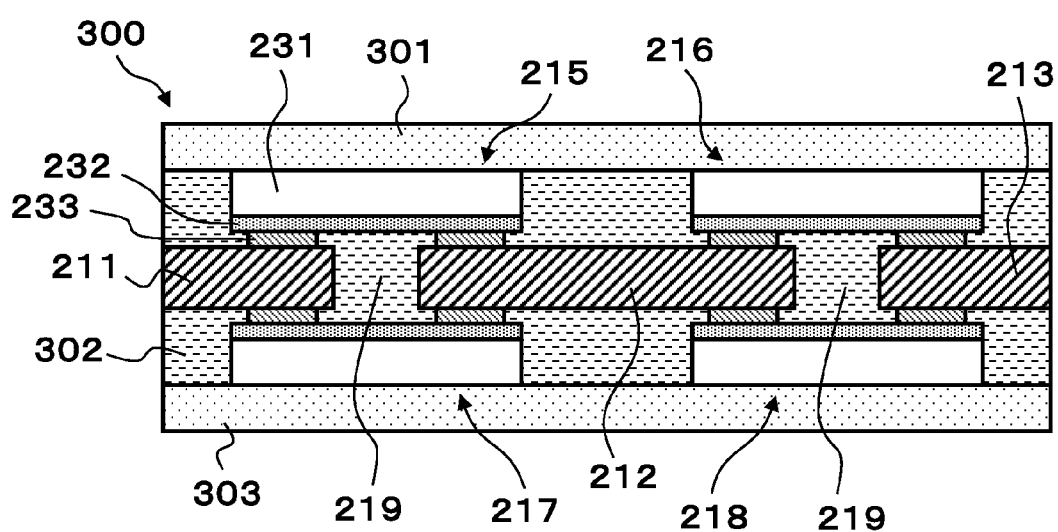
FIG. 23 is a cross-sectional view taken along line II' in FIG. 22(b).

FIG. 23 is a cross-sectional view taken along line II' in FIG. 22(b).

The LED device 300 includes the leadframes 211, 212, and 213, reflective member 302, phosphor sheets 301 and 303, and LED dies 215 to 218. In the LED device 300, as in the LED device 200 (see FIG. 14), the LED dies 215 and 216 are each flip-chip mounted on the front surfaces of two of the leadframes 211 to 213 in such a manner as to straddle the gap 219. Similarly, the LED dies 217 and 218 are each flip-chip mounted on the back surfaces of the leadframes 211 to 213 in such a manner as to straddle the gap 219. The leadframes 211 to 213 and the LED dies 215 to 218 are the same between the LED device 300 and the LED device 200. The surface treatment of the leadframes 211 to 213 and the connecting structure connecting the LED dies 215 to 218 to the leadframes 211 to 213 are also the same between the LED device 300 and the LED device 200.

In the LED device 300, the bottom and side faces of the LED dies 215 to 218 are covered with the reflective member 302, while the top faces of the LED dies 215 to 218 are covered with the respective phosphor sheets 301 and 303. That is, in the LED device 300, the reflective member 302 and the phosphor sheets 301 and 303 together constitute the covering member. The reflective member 302 is formed by mixing fine reflective particles such as titanium oxide or alumina into a binder such as a silicone resin or organopolysiloxane, kneading the mixture, and curing the mixture. The phosphor sheets 301 and 303 are each formed by mixing phosphors into a silicone resin, kneading the mixture, and curing the mixture. The phosphor sheets 301 and 303 are bonded to the reflective member 302 and the top faces of the LED dies 215 to 218 by a transparent adhesive (not shown).

Figure 24:
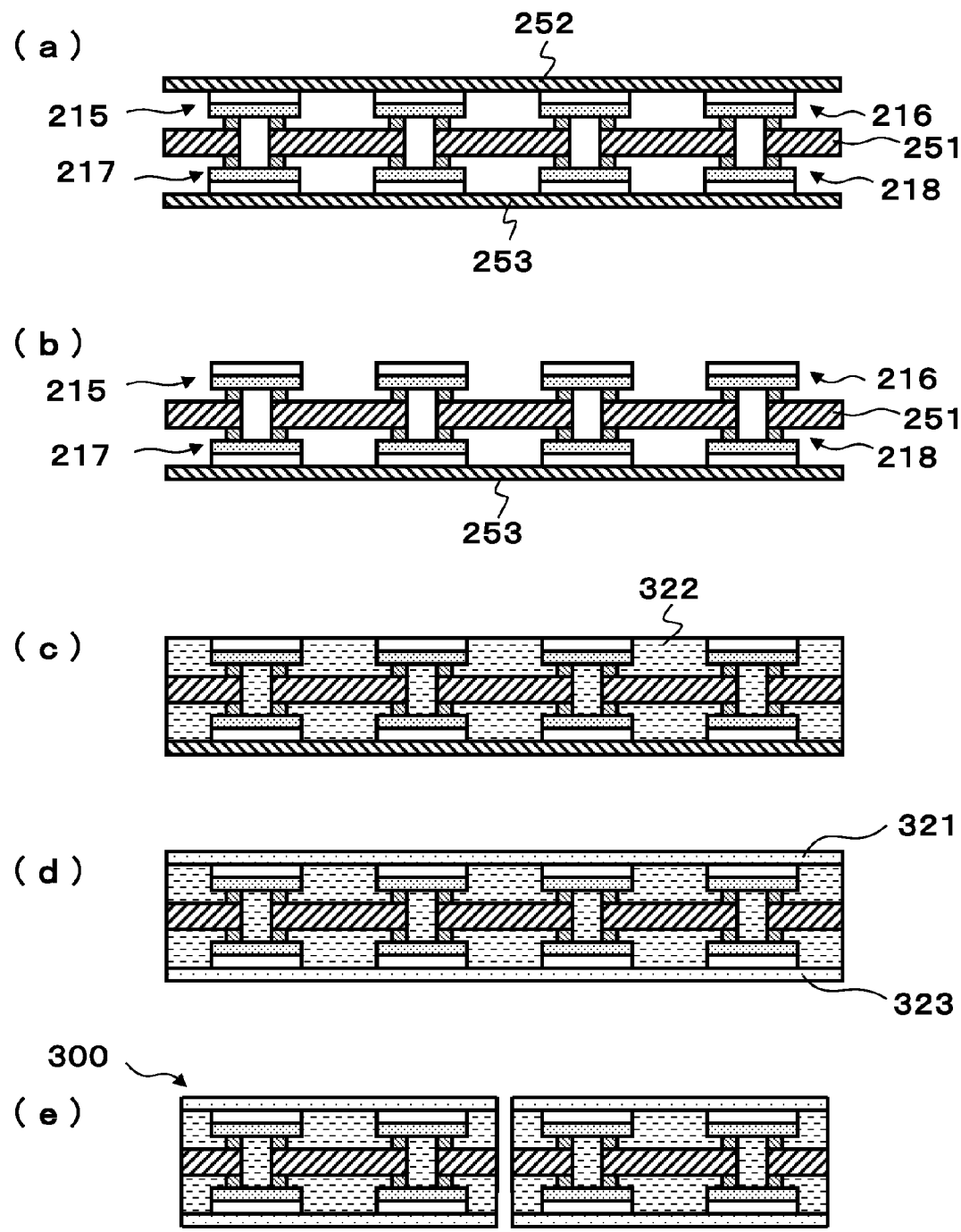
FIG. 24 is a diagram for explaining a fabrication method for the LED device 300.
Figure 25:
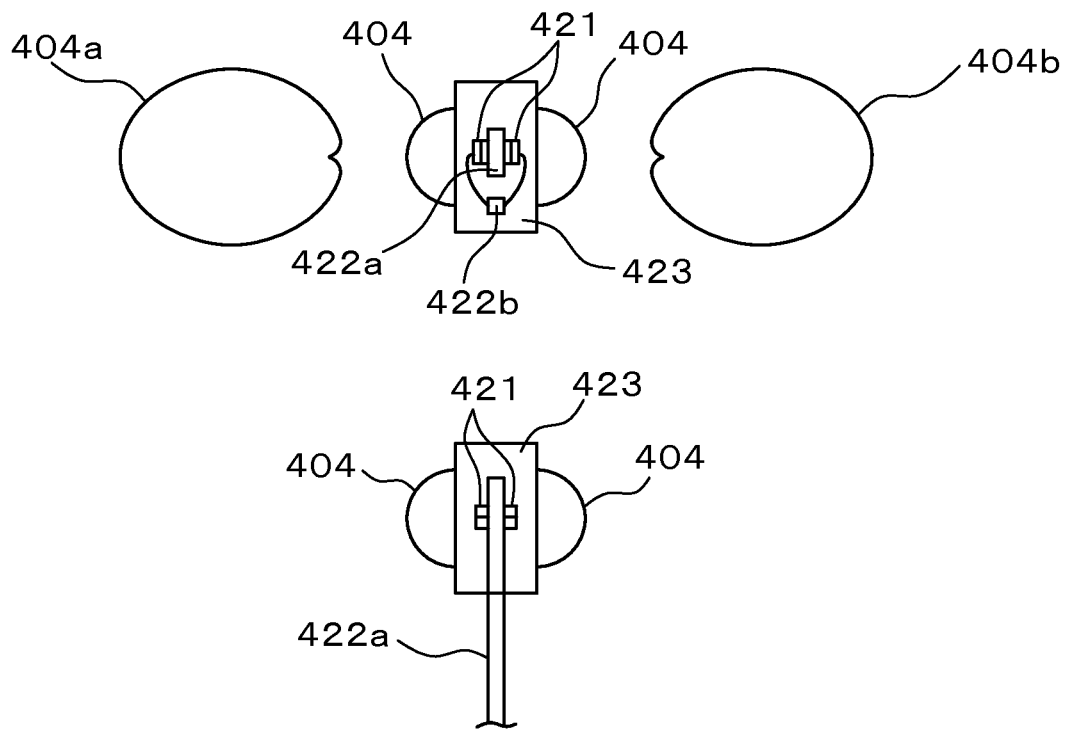
FIG. 25 is a diagram showing an LED device (1) according to the prior art.
Figure 26:
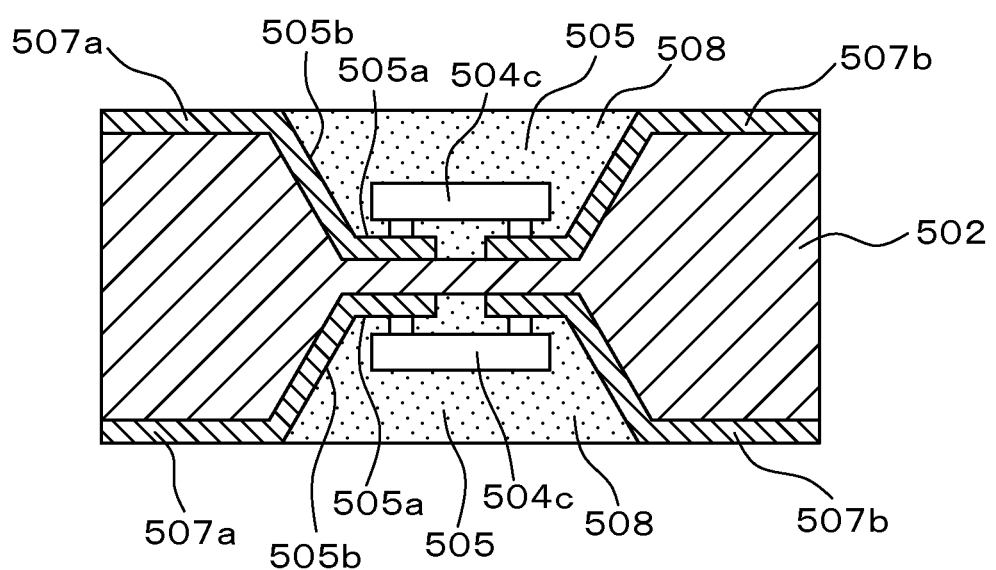
FIG. 26 is a diagram showing an LED device (2) according to the prior art.
Figure 27:
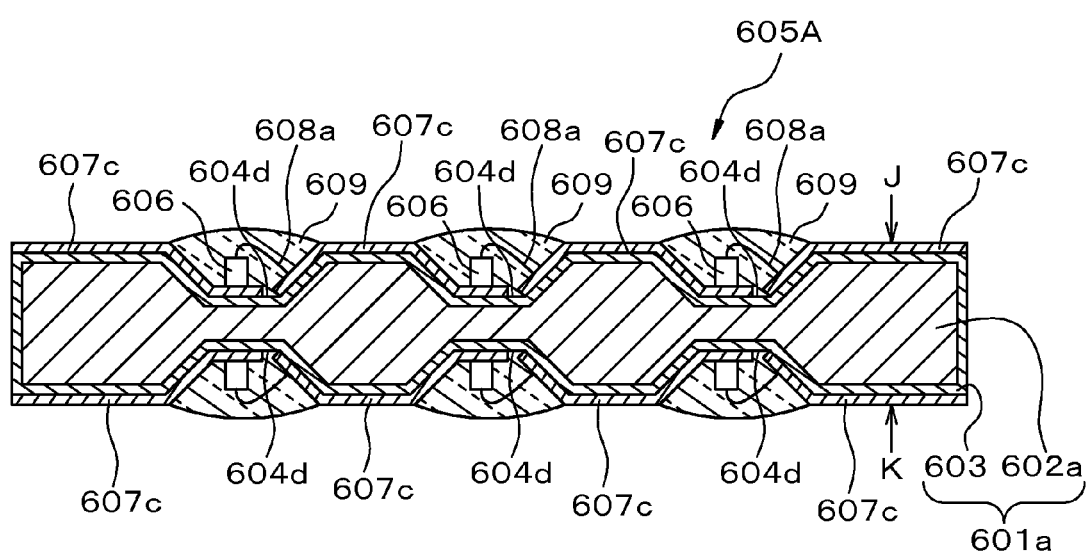
FIG. 27 is a diagram showing an LED device (3) according to the prior art.

FIG. 24 is a diagram for explaining a fabrication method for the LED device 300.

The fabrication method of the LED device 300 employs the same steps as the step of preparing the large-sized leadframe (see FIG. 17(a)), the step of placing the LED dies on the bonding sheets (see FIGS. 17(b) and 17(c)), and the step of connecting the LED dies to the large-sized leadframe (see FIG. 17(d)) shown in the fabrication method of the LED device 200, and therefore, the description of these steps will not be repeated here.

FIG. 24(a) is the same diagram as that shown in FIG. 17(d), and shows the starting step (initial condition) of the process that characterizes the fabrication method of the LED device 300.

From the condition shown in FIG. 24(a), only the adhesive sheet 252 is removed (see FIG. 24(b)). FIGS. 24(b), 24(c), and 24(d) show the step for covering the LED dies 215 to 218 with a reflective member 322 and phosphor sheets 321 and 323.

Next, the reflective member 322 before curing is filled into the space between the LED dies 215 to 218 to cover the bottom and side faces of the LED dies 215 to 218 (see FIG. 24(c)). After filling, the reflective member 322 is cured at about 150° C. The reflective member 322 can be applied using a squeegee, and the portions of the reflective member 322 that remain on the top faces of the LED dies 215 and 216 after curing are removed by polishing. Alternatively, the reflective member 322 whose amount is accurately measured using a dispenser may be applied. In that case, there is no need to polish the top faces of the LED dies 215 and 216.

Next, the top faces of the LED dies 215 to 218 are covered with the respective phosphor sheets 321 and 323 (see FIG. 24(d)). A transparent adhesive material is applied over the top faces of the LED dies 215 and 216 as well as the upper surface of the reflective member 322, and the phosphor sheet 321 is bonded. In parallel with this step, the adhesive sheet 253 is removed, a transparent adhesive material is applied over the top faces (the lower faces in the figure) of the LED dies 217 and 218 as well as the surface of the reflective member 322, and the phosphor sheet 323 is bonded. Instead of forming the phosphor sheets 321 and 323, a fluorescent resin prepared by mixing phosphors into a transparent binder such as silicone may be applied over the top faces of the LED dies 215 to 218 as well as the surfaces of the reflective member 322, the resin then being cured to form phosphor layers. In this case, the phosphor layers are used as the fluorescent members for covering the top faces of the LED dies 215 to 218. However, when the phosphor sheets 321 and 323 are used as the fluorescent members as in the LED device 300, the advantage is that the covering step can be accomplished in a short time, because the covering by the reflecting member 322 can be performed concurrently with the preparation of the phosphor sheets 321 and 323.

Finally, the large-sized leadframe 251 covered as described above is diced into individual LED devices 300 (see FIG. 24(e)). FIG. 24(e) shows the same step as that of FIG. 17(f), except that the covering member used is different.

In the LED devices 200, 270, and 300 described above, the forward voltage drop must be made equal for all the four LED dies 215 to 218 or 284 to 287. For example, in the fabrication process, the difference in forward voltage drop must be held to within 0.1 V. That is, in the fabrication process, after dicing the wafer containing a large number of LED dies, the LED dies are sorted out according to the forward voltage drop. If the LED dies are arranged with a prescribed pitch and orientation on the respective adhesive sheets 252 and 253 while sorting out the LED dies, the pickup job can be standardized, and the fabrication process can be shortened.

In the LED devices 200, 270, and 300 described above, the cut faces of the leadframes 211 and 213 or the leadframes 271 and 272 are made flush with the cut faces of the covering member 214 or 273 (the reflective member 302 in the case of the LED device 300). When mounting the LED device 200, 270, or 300 on a mother substrate, if the connection strength is not sufficient, the end portions of the leadframes 211 and 213 or the leadframes 271 and 272 may be made to protrude from the respective cut faces of the covering member 214 or 273 (the reflective member 302 in the case of the LED device 300). For example, in FIG. 13(a), the leadframes 211 and 213 may be made to extend horizontally. In this case, the outwardly protruding portions of the leadframes 211 and 213 or the leadframes 271 and 272 may be bent to conform to the side faces of the LED device 200, 270, or 300.

In the LED device 300, the side faces of the LED dies 215 to 218 are covered with the reflective member 302, and the phosphor sheets 301 and 303 are bonded to the upper and lower surfaces of the reflective member 302 as well as to the top faces of the respective LED dies 215 to 218 (see FIG. 23). However, if the light is to be emitted only in the direction vertical to the leadframes 211 to 213, the reflective member may be provided not only on the side faces of the LED dies to which the fluorescent members are laminated but also on the side faces of the fluorescent members laminated to the top faces of the respective LED dies. To fabricate such an LED device, a phosphor layer is formed in advance on the sapphire substrate at the wafer level, and then the wafer is diced into individual LED dies each covered with the phosphor layer; when such LED dies are obtained, a batch fabrication method is applied that uses two adhesive sheets and a large-sized leadframe, as illustrated in connection with the fabrication method for the LED device 200. That is, after mounting the LED dies on both sides of the large-sized leadframe, the reflective member is filled into the space surrounding the respective LED dies, and finally, the large-sized leadframe is cut apart. It is preferable that the binder to be used in the phosphor layer is selected from among transparent inorganic materials such as glass that can withstand the temperature applied when joining the LED dies to the large-sized leadframe.

What is claimed is:

1. A semiconductor light emitting device comprising:
    a first lead frame;
    a second lead frame disposed along a longitudinal direction of said first lead frame and having one end portion which is located at an end portion of said first lead frame in order to form a gap therebetween;
a plurality of semiconductor light emitting elements which are flip-chip mounted on front and back surfaces of said first lead frame and said second lead frame in such a manner as to straddle said gap; and
a covering member that covers said plurality of semiconductor light emitting elements, and wherein
another end portion of said first lead frame and another end portion of said second lead frame are exposed from said covering member,
said first lead frame and said second lead frame are disposed perpendicular to a mother board,
said first lead frame and said second lead frame are connected to the mother board at the exposed portion from said covering member.

2. The semiconductor light emitting device according to claim 1, wherein a surface of said another end portion of said first lead frame and a surface of said covering member are at the same level as each other, and a surface of said another end portion of said second lead frame and the surface of said covering member are at the same level as each other.

3. The semiconductor light emitting device according to claim 1, wherein said covering member includes a reflective member containing fine reflective particles and a fluorescent member containing a phosphor.

4. A semiconductor light emitting device comprising:
a first lead frame;
a second lead frame disposed along a longitudinal direction of said first lead frame and having one end portion which is located at an end portion of said first lead frame in order to form a gap therebetween;
a plurality of semiconductor light emitting elements which are flip-chip mounted on front and back surfaces of said first lead frame and said second lead frame in such a manner as to straddle said gap; and
a covering member that covers said plurality of semiconductor light emitting elements, and wherein
another end portion of said first lead frame and another end portion of said second lead frame are exposed from said covering member,
said first lead frame and said second lead frame are disposed perpendicular to a mother board,
said first lead frame and said second lead frame are connected to the mother board at the exposed portion from said covering member,
wherein said covering member includes a reflective member containing fine reflective particles and a fluorescent member containing a phosphor,
said fluorescent member includes a first fluorescent member and a second fluorescent member,
said reflective member is disposed along outer peripheries of said plurality of lead frames and covers side faces of said first and second fluorescent members,
said first fluorescent member covers top faces of said plurality of semiconductor light emitting elements and a top face of said second fluorescent member, and
said second fluorescent member is filled into space formed between said reflective member and said plurality of semiconductor light emitting elements and into space formed between said plurality of semiconductor light emitting elements that are mounted on the front and back surfaces of said plurality of lead frames so as to face each other.

5. The semiconductor light emitting device according to claim 3, wherein said fluorescent member covers top faces of said plurality of semiconductor light emitting elements, and
said reflective member is applied to cover side faces of said plurality of semiconductor light emitting elements and to fill space formed between said plurality of semiconductor light emitting elements that are mounted on the front and back surfaces of said plurality of lead frames so as to face each other.

6. A semiconductor light emitting device comprising:
a first lead frame;
a second lead frame disposed along a longitudinal direction of said first lead frame and having one end portion which is located at an end portion of said first lead frame in order to form a first gap therebetween;
a third lead frame disposed along the longitudinal direction of said first lead frame and having one end portion which is located in close proximity to said another end portion of said second lead frame in order to form a second gap therebetween;
a plurality of semiconductor light emitting elements which are flip-chip mounted on front and back surfaces of said first lead frame, said second lead frame and said third lead frame in such a manner as to straddle said first and second gaps; and
a covering member that covers said plurality of semiconductor light emitting elements, and wherein
another end portion of said first lead frame and another end portion of said third lead frame are exposed from said covering member,
said first lead frame, said second lead frame and said third lead frame are disposed perpendicular to a mother board,
said first lead frame and said third lead frame are connected to the mother board at the exposed portion from said covering member.

7. The semiconductor light emitting device according to claim 6, wherein a surface of said another end portion of said first lead frame and a surface of said covering member are at the same level as each other, and a surface of said another end portion of said third lead frame and the surface of said covering member are at the same level as each other.

8. A light emitting device comprising:
a mother board having a mother board electrodes; and
a semiconductor light emitting device mounted on said mother board, and wherein
said semiconductor light emitting device comprises:
a first lead frame;
a second lead frame disposed along a longitudinal direction of said first lead frame and having one end portion which is located at an end portion of said first lead frame in order to form a gap therebetween;
a plurality of semiconductor light emitting elements which are flip-chip mounted on front and back surfaces of said first lead frame and said second lead frame in such a manner as to straddle said gap; and
a covering member that covers said plurality of semiconductor light emitting elements, and wherein
another end portion of said first lead frame and another end portion of said second lead frame are exposed from said covering member,
said first lead frame and said second lead frame are disposed perpendicular to said mother board,
said first lead frame and said second lead frame are connected to said mother board electrodes of said mother board at the exposed portion from said covering member.

9. The light emitting device according to claim 8, further comprising a light conducting plate disposed on said mother board and having an opening, and wherein
said semiconductor light emitting device is mounted on said mother board within said opening.

* * * * *